(12) United States Patent
Chang et al.

(10) Patent No.: US 6,420,225 B1
(45) Date of Patent: Jul. 16, 2002

(54) METHOD OF FABRICATING POWER RECTIFIER DEVICE

(75) Inventors: Paul Chang, Saratoga; Vladimir Rodov, Redondo Beach; Geeng-Chuan Chern, Cupertino; Charles Lin, Fremont; Ching-Lang Chiang, Saratoga, all of CA (US)

(73) Assignee: APD Semiconductor, Inc., San Jose, CA (US)

( * ) Notice: Subject to any disclaimer, the term of this patent is extended or adjusted under 35 U.S.C. 154(b) by 0 days.

(21) Appl. No.: 09/805,815

(22) Filed: Mar. 13, 2001

Related U.S. Application Data

(60) Continuation-in-part of application No. 09/283,537, filed on Apr. 1, 1999, now Pat. No. 6,331,455, which is a division of application No. 09/544,730, filed on Apr. 6, 2000, which is a division of application No. 09/742,262, filed on Dec. 19, 2000.

(51) Int. Cl.$^7$ .......................................... H01L 21/8234
(52) U.S. Cl. ....................... 438/237; 438/167; 438/173; 438/586
(58) Field of Search ................................. 438/237, 173, 438/586, 597, 167, 268, 212, 209, 206; 257/266, 378

(56) References Cited

U.S. PATENT DOCUMENTS

| | | | | |
|---|---|---|---|---|
| 4,982,260 A | * | 1/1991 | Chang et al. | ................... 357/38 |
| 5,430,315 A | * | 7/1995 | Rumennik | ................... 257/331 |
| 5,818,084 A | | 10/1998 | Williams et al. | |
| 5,825,079 A | | 10/1998 | Metzler et al. | |
| 5,877,515 A | | 3/1999 | Ajit | |
| 6,097,046 A | * | 8/2000 | Plumton | ...................... 257/266 |
| 6,186,408 B1 | * | 2/2001 | Rodov et al. | ................ 438/268 |

* cited by examiner

*Primary Examiner*—Chandra Chaudhari
*Assistant Examiner*—Yennhu B. Huynh
(74) *Attorney, Agent, or Firm*—Townsend and Townsend and Crew LLP; Henry K. Woodward

(57) ABSTRACT

A vertical semiconductor rectifier device includes a semiconductor substrate of first conductivity type and having a plurality of gates insulatively formed on a first major surface and a plurality of source/drain regions of the first conductivity type formed in surface regions of second conductivity type in the first major surface adjacent to the gates. A plurality of channels of the second conductivity type each abuts a source/drain region and extends under a gate.

20 Claims, 37 Drawing Sheets

METHOD OF FABRICATING POWER RECTIFIER DEVICE

CROSS-REFERENCES TO RELATED APPLICATIONS

This application is related to and a continuation in part of pending application Ser. No. 09/283,537, filed Apr. 1, 1999 now U.S. Pat. No. 6,331,455 for "Power Rectifier Device", the description of which is incorporated herein by reference, pending application Ser. No. 09/544,730, filed Apr. 6, 2000 for "Method of Fabricating Power Rectifier Device to Vary operating Parameters and Resulting Device", the description of which is incorporated by reference and pending application Ser. No. 09/742,262, filed Dec. 19, 2000 for "Improved Method of Fabricating Power Rectifier Device to Vary Operating Parameters and Resulting Device", the description of which is incoroporated by reference.

BACKGROUND OF THE INVENTION

This invention relates generally to power semiconductor devices, and more particularly the invention relates to a power semiconductor rectifier device and a method of making same.

Power semiconductor rectifiers have a variety of applications including use in power supplies and power converters. Heretofore, Schottky diodes have been used in these applications. A Schottky diode is characterized by a low turn-on voltage, fast turn-off, and nonconductance when the diode is reverse biased. However, to create a Schottky diode a metal-silicon barrier must be formed. In order to obtain proper characteristics for the Schottky diode, the barrier metal is likely different than the metal used in other process steps such as metal ohmic contacts. Further, Schottky diode rectifiers suffer from problems such as high leakage current and reverse power dissipation. Also, these problems increase with temperature causing reliability problems for power supply applications. Therefore the design of voltage converters using Schottky barrier diodes can cause design problems for many applications.

A semiconductor power rectifier device is known which does not employ Schottky barriers. FIG. 1 from U.S. Pat. No. 5,818,084 is a schematic of such a device which comprises of a MOSFET transistor shown generally at 10 having a source/drain 12 which is shorted to a gate 14. A parasitic diode 16 is connected from the source/drain 12 to the drain/source 18. The patent discloses the use of a trench for accommodating the gate.

Copending application Ser. No. 09/283,537, supra, discloses a vertical semiconductor power rectifier device which employs a large number of parallel connected cells, each comprising a MOSFET structure with a gate-to-drain short via common metallization. This provides a low $V_f$ path through the channel regions of the MOSFET cells to the source region on the other side of the device. The method of manufacturing the rectifier device provides highly repeatable device characteristics at reduced manufacturing costs. The active channel regions of the device are defined using pedestals in a double spacer, double implant self-aligned process. The channel dimensions and doping characteristics may be precisely controlled despite inevitable process variations and spatial sidewall formation.

Copending applications Ser. No. 09/544,730 and 14987-000700US, supra disclose improved methods of manufacturing a semiconductor power rectifier device and the resulting structure. As shown in the section view of FIG. 2 the semiconductor substrate 20 and epitaxial layer 22 functions as one source/drain (e.g. the drain) of the device and a plurality of second source/drain (e.g. source) regions 24 are formed on a major surface of the substrate along with the plurality of gate electrodes with the source/drain and gate electrodes 26 positioned within a guard ring 28 and, optionally, conductive plugs 30 in the major surface. A conductive layer 32 contacts source/drain regions 24 and gate electrodes 26, and conductive layer 34 contacts substrate 20.

The semiconductive rectifier device is fabricated using conventional semiconductor processing steps including photoresist masking, plasma etching, and ion implantation in forming the guard ring, conductive plug, source/drain regions, and gate electrodes overlying device channel regions. In accordance with one feature of the disclosed process, a photoresist mask is used in defining the gate oxide and gate of the device which is anisotropically or otherwise etched to expose peripheral portions of the gate electrode through which ions are implanted to create channel regions in body regions under and controlled by the gate electrode. FIG. 3 is a plan view of the device showing the boundary of substrate 20, guard ring 28, optional plugs 30 and source/drains 24 in unit cells, and top electrode 32. The P-N junction 36 between the channel region and the epitaxial layer 22 of the bottom source/drain is defined by shallow uniform boron implant which forms p-region 38.

SUMMARY OF THE INVENTION

The present invention is an improvement to the process and device of copending application Ser. No. 09/544,730 and application Ser. No. 14987-000700US.

In one embodiment polysilicon gate processing is used, and spacers can be provided for protecting the channel region from metallization used in forming the common contact to the gates, top source/drain, and shunt diode. In another embodiment a metal gate process is provided. Spacer technology provides for process compatibility with older photo process equipment.

The invention and objects and features thereof will be more readily apparent from the following detailed description and appended claims when taken with the drawings.

BRIEF DESCRIPTION OF THE DRAWINGS

FIGS. 17A–20A are section views illustrating alternative steps in the process of FIGS. 4–19 in accordance with another embodiment of the invention.

DETAILED DESCRIPTION OF THE ILLUSTRATIVE EMBODIMENTS

Figure 4:
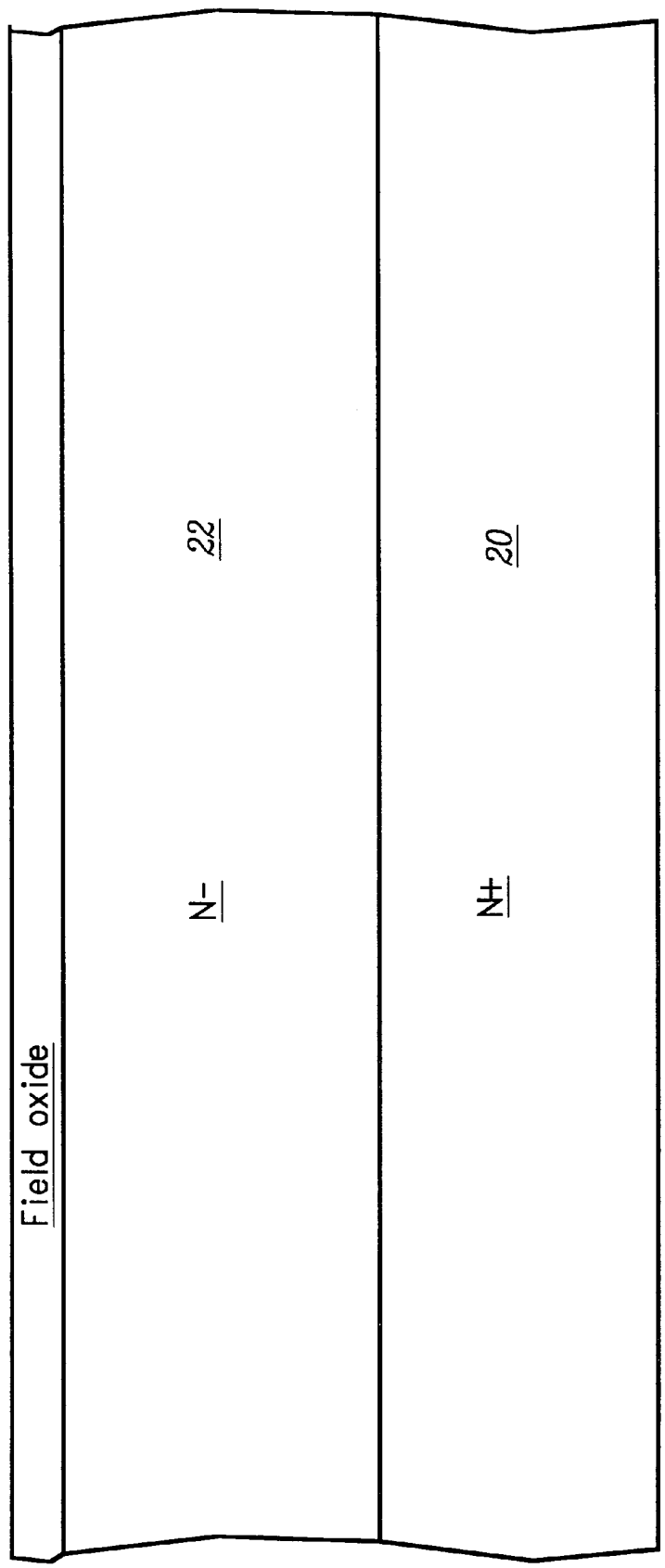
FIGS. 4–19 are section views illustrating steps in fabricating a device in accordance with one embodiment of the invention.
Figure 5:
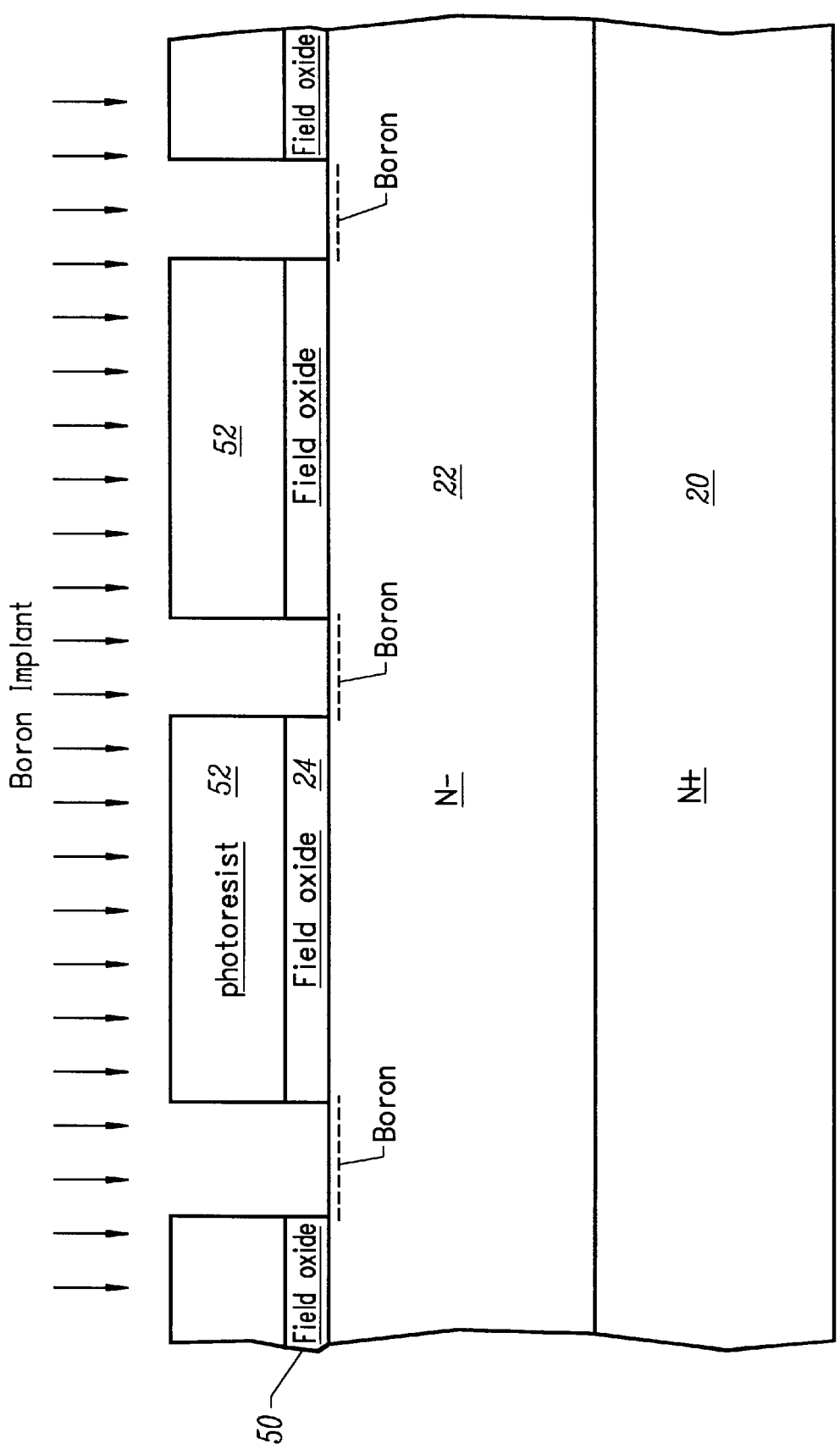
Figure 6:
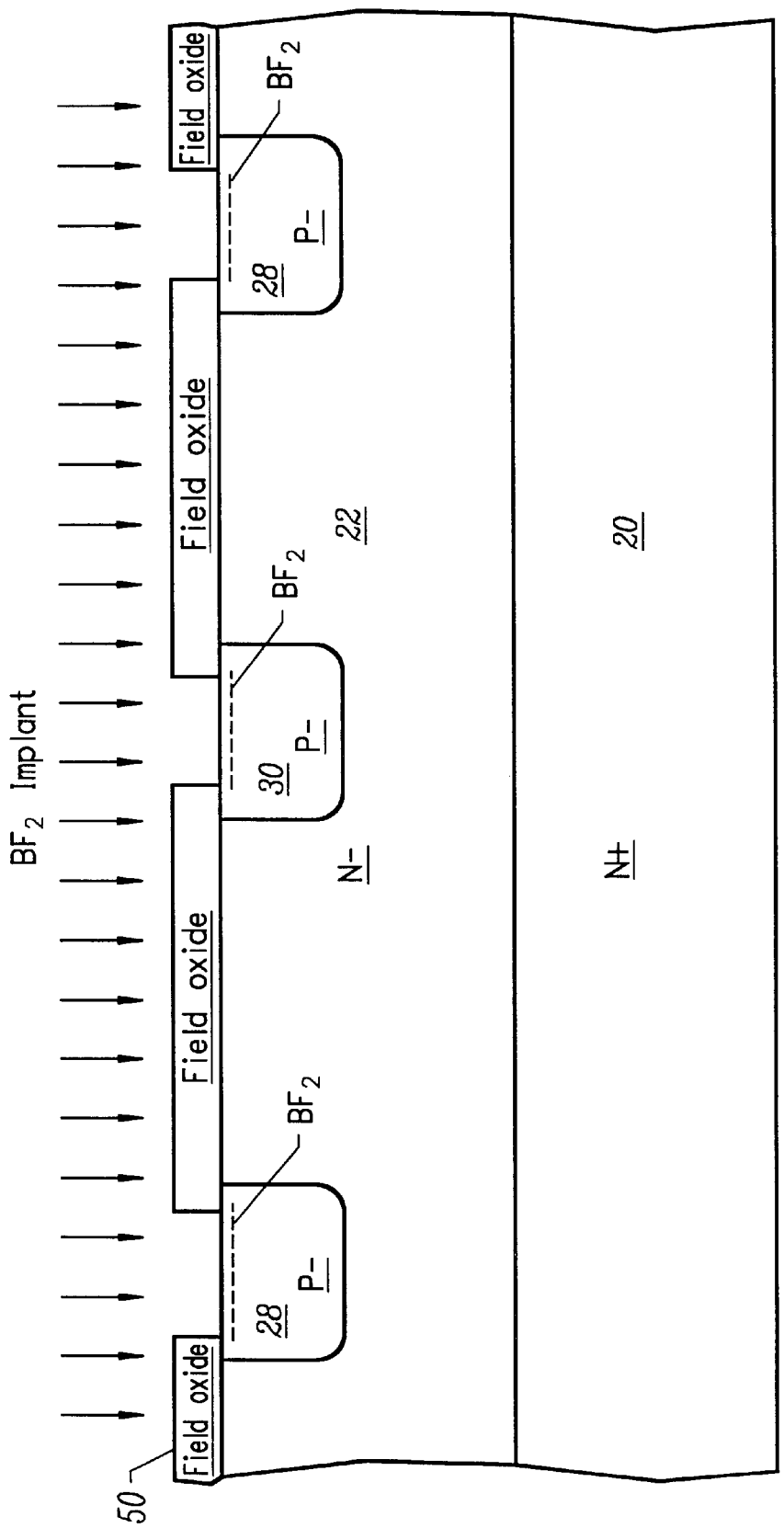

FIGS. 4–19 are section views illustrating steps in fabricating a device in accordance with one embodiment of the inventor. In FIG. 4, a semiconductor body is provided including N+ substrate 20 on which is formed N− epitaxial layer 22 having a resistivity on the order of 0.1–10 ohm-cm. Field oxide 50 is grown or deposited on the surface of layer 22 to a thickness of 100–1000 nm. Thereafter, as shown in FIG. 5 a photoresist pattern 52 is selectively formed over field oxide 50 by photoresist masking and etching techniques to remove field oxide in guard ring region and plug region, and a P-type dopant boron or $BF_2$ is then implanted through openings in the photoresist. The boron or $BF_2$ can be implanted before or after photoresist removal, and as shown in FIG. 6 a boron thermal drive-in forms deep P-regions including an annular guard ring 28 which defines a device region in layer 22 and, optionally, one or more P-doped conductive plugs 30 within the device region. Plugs 30 are not essential in the device, especially for small area rectifier devices in which the guard ring alone will suffice in forming a diode with layer 22. Dopant concentration of the P-doped regions is on the order of $E11–E14/cm^2$. A second boron or $BF_2$ implant is then made in the surface of the P-doped regions for high surface concentration ($E12–E15/cm^2$) to form good ohmic contacts, and then the boron or $BF_2$ is activated by rapid thermal annealing.

Figure 7:
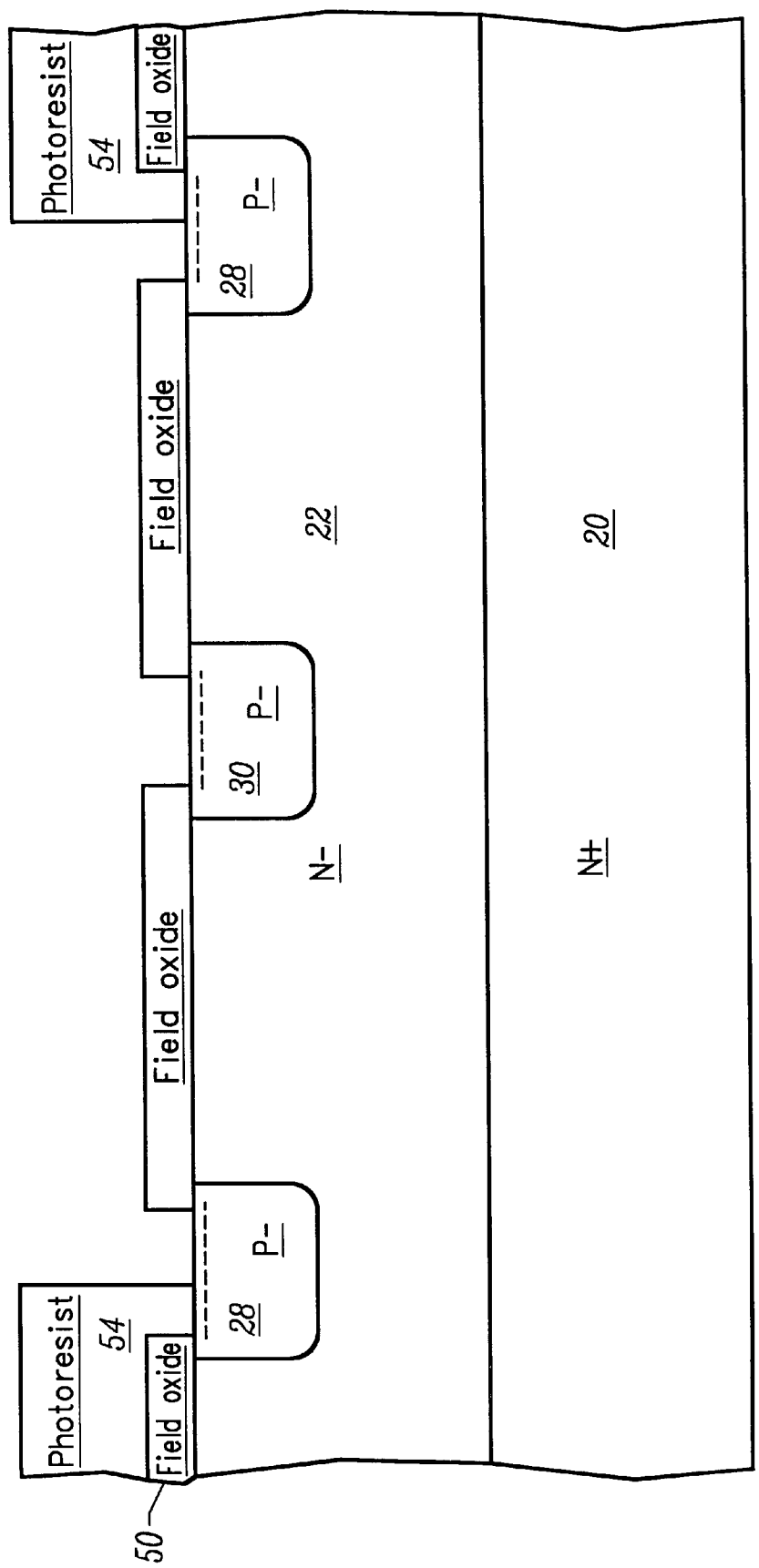
Figure 8:
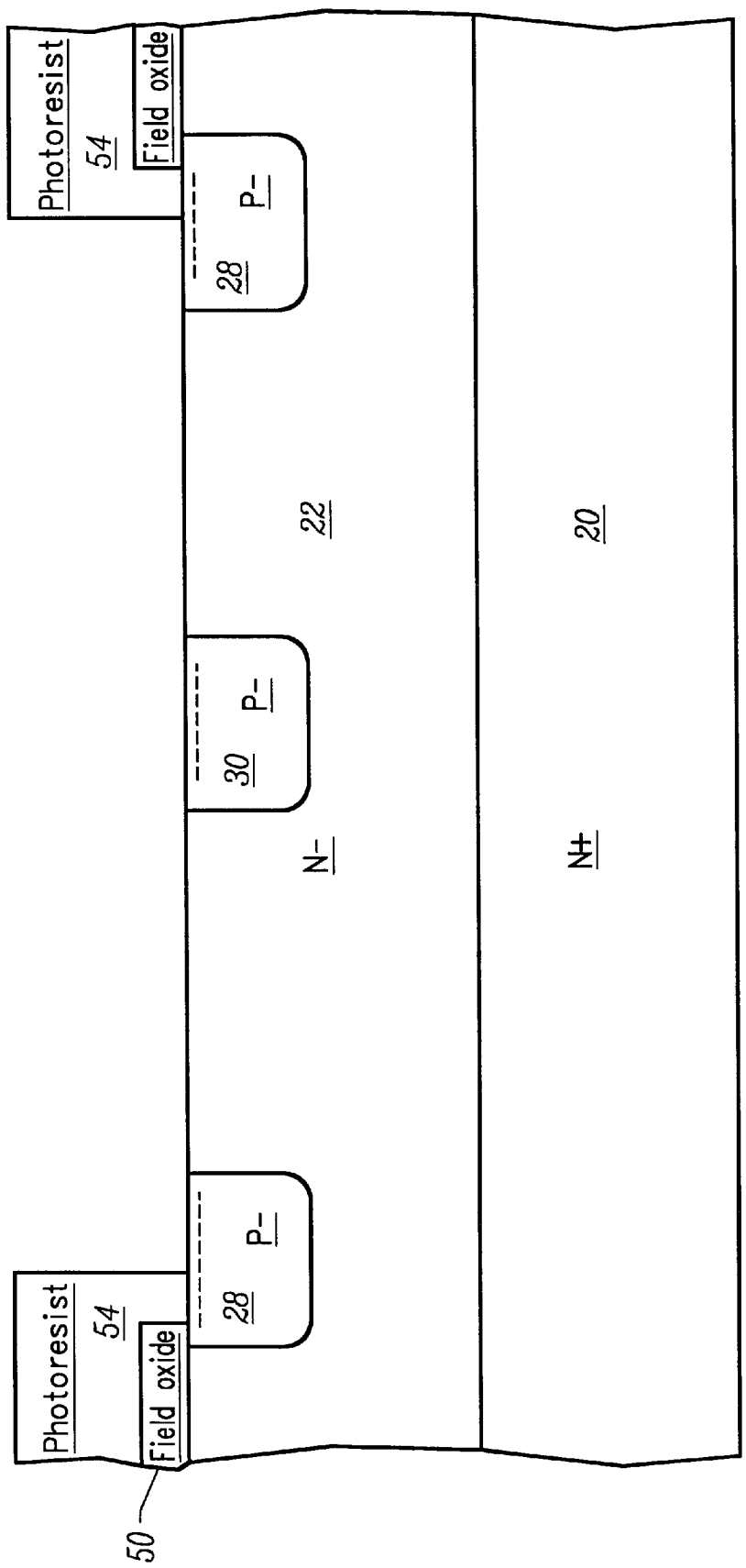
Figure 9:
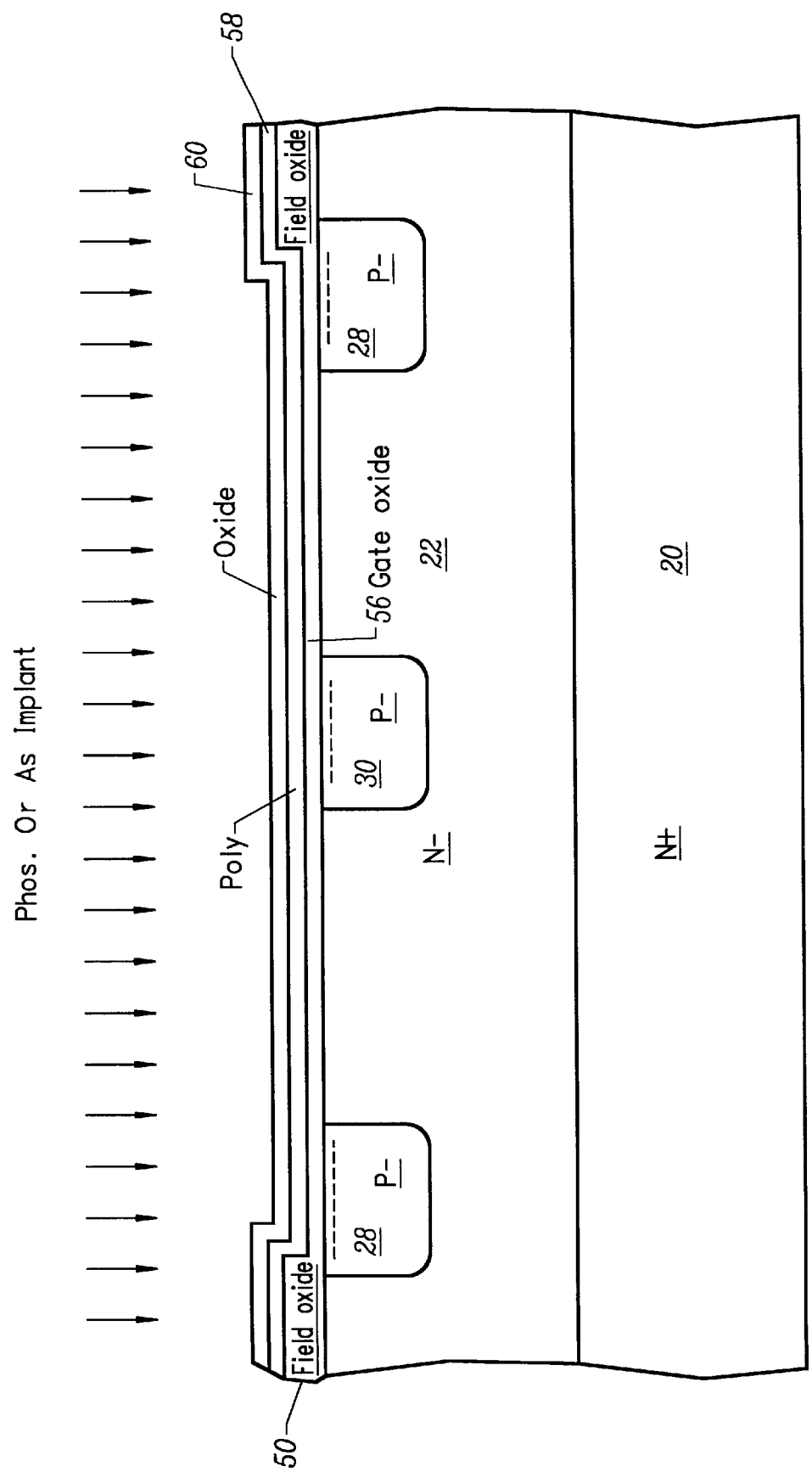

Next as shown in FIG. 7, a photoresist pattern 54 is developed to cover the area outside of the device region, and then field oxide 50 in the device region is removed by etching as shown in FIG. 8. Thereafter, as shown in FIG. 9, photoresist 54 is removed and a gate silicon oxide layer 56 of 5–50 nm is formed. A doped or undoped polysilicon layer 58 of 10–80 nm thickness is then deposited over gate oxide 56 and optionally, an 8–40 nm insulator 60 such as silicon oxide layer is formed if the following implant energy is higher than 25 keV. If the implant energy is less than 25 KeV, then insulator 60 is not needed. An arsenic or phosphorous implant can be made now. In case a doped polysilicon layer 58 is used, then implant is not necessary.

Figure 10:
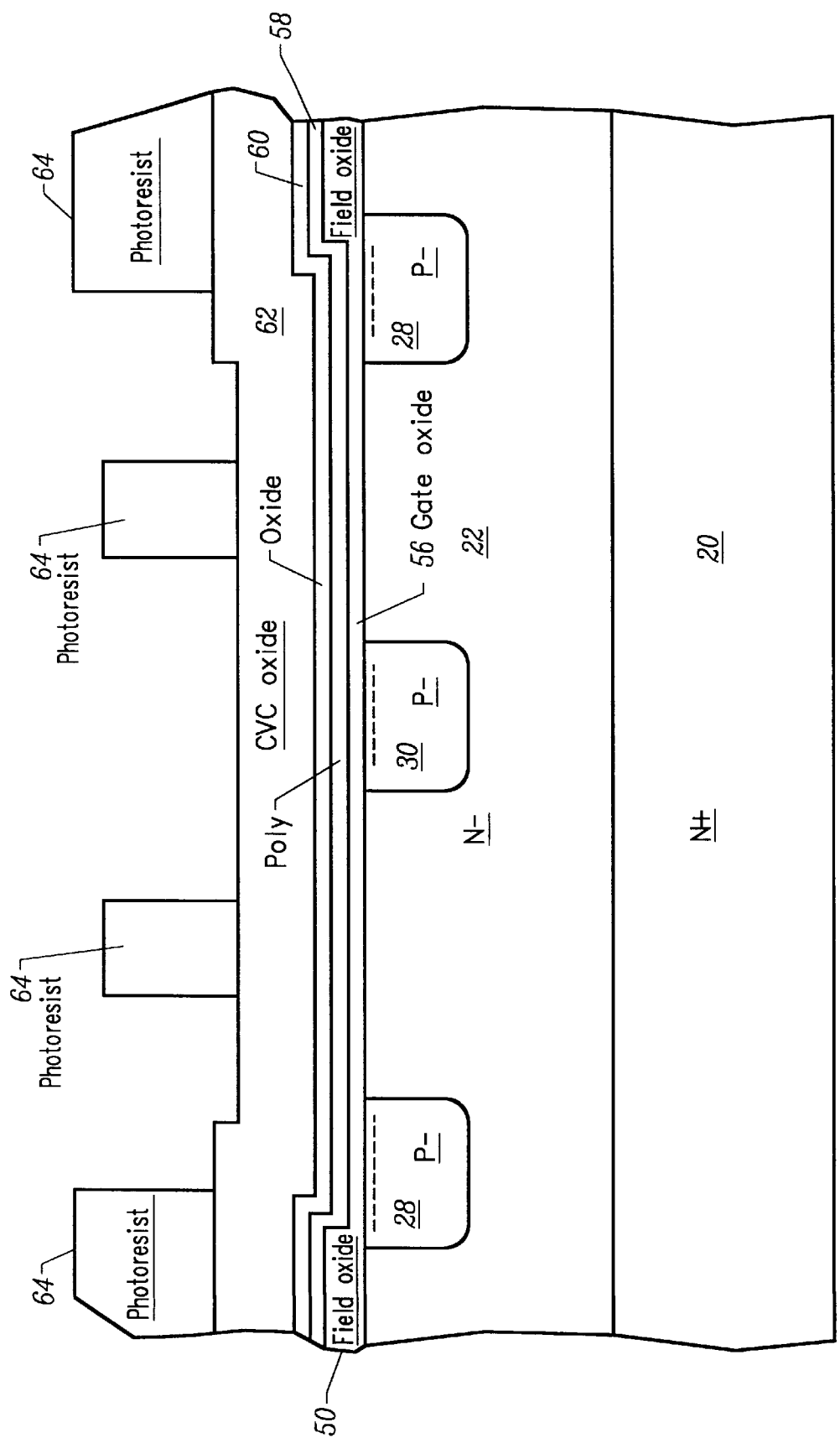
Figure 11:
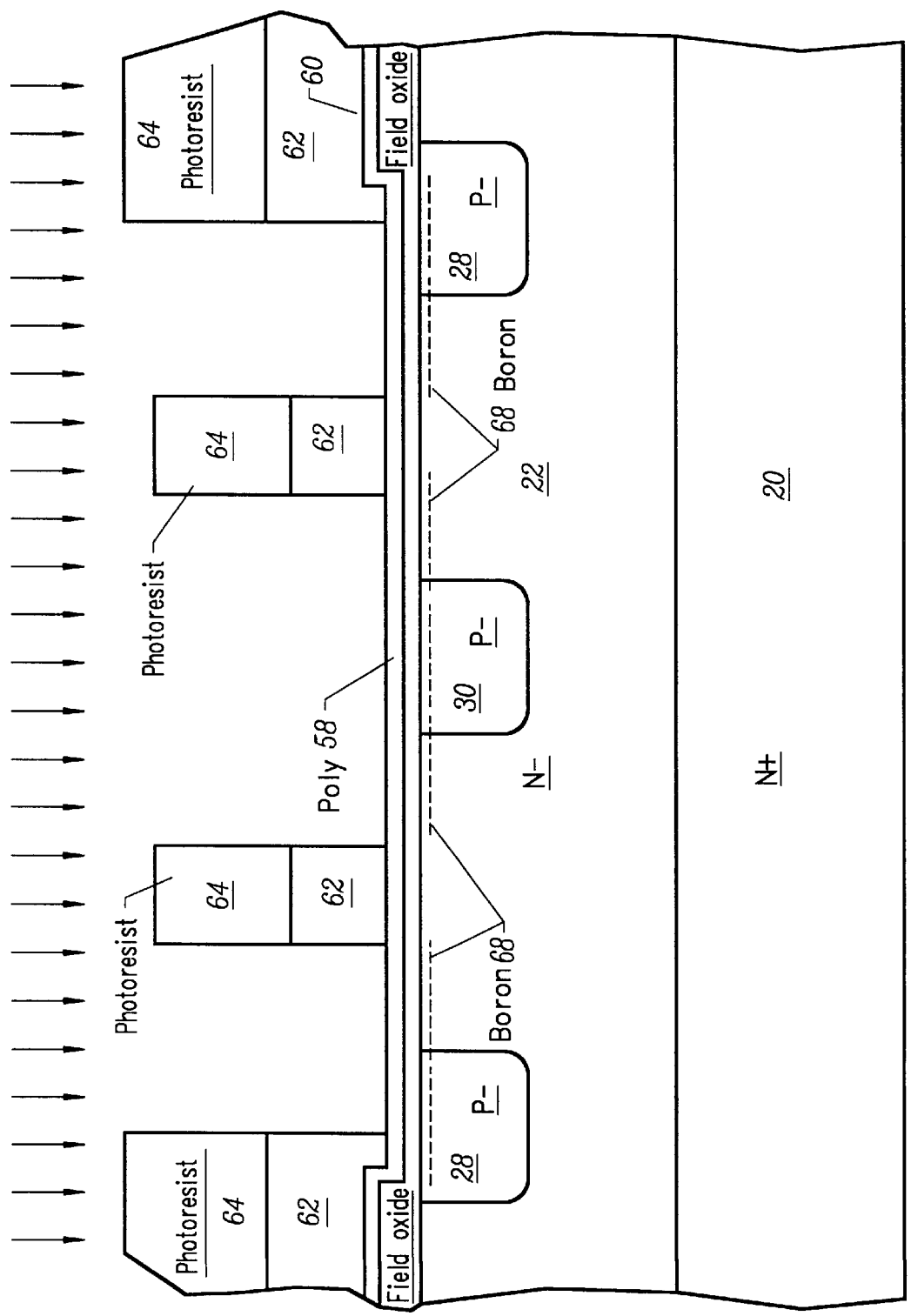

As shown in FIG. 10, 200–1200 nm of silicon oxide 62 is then formed by chemical vapor deposition, and then a photoresist pattern 64 is formed over layer 62 to define the MOS transistor units. Thereafter as shown in FIG. 11 an anisotropic oxide etch defines a pedestal pattern, and a first boron or $BF_2$ implants boron ions 68 in the surface of epitaxial layer 22. The boron dose is on the order of $E12–13/cm^2$ with an energy of 20–80 KeV. P-dopant 68 helps define the channel region and separates the top source/drain region (yet to be formed) from the N− epitaxial layer 22. Layer 60 is not shown in FIG. 11 since the layer is optional.

Figure 12:
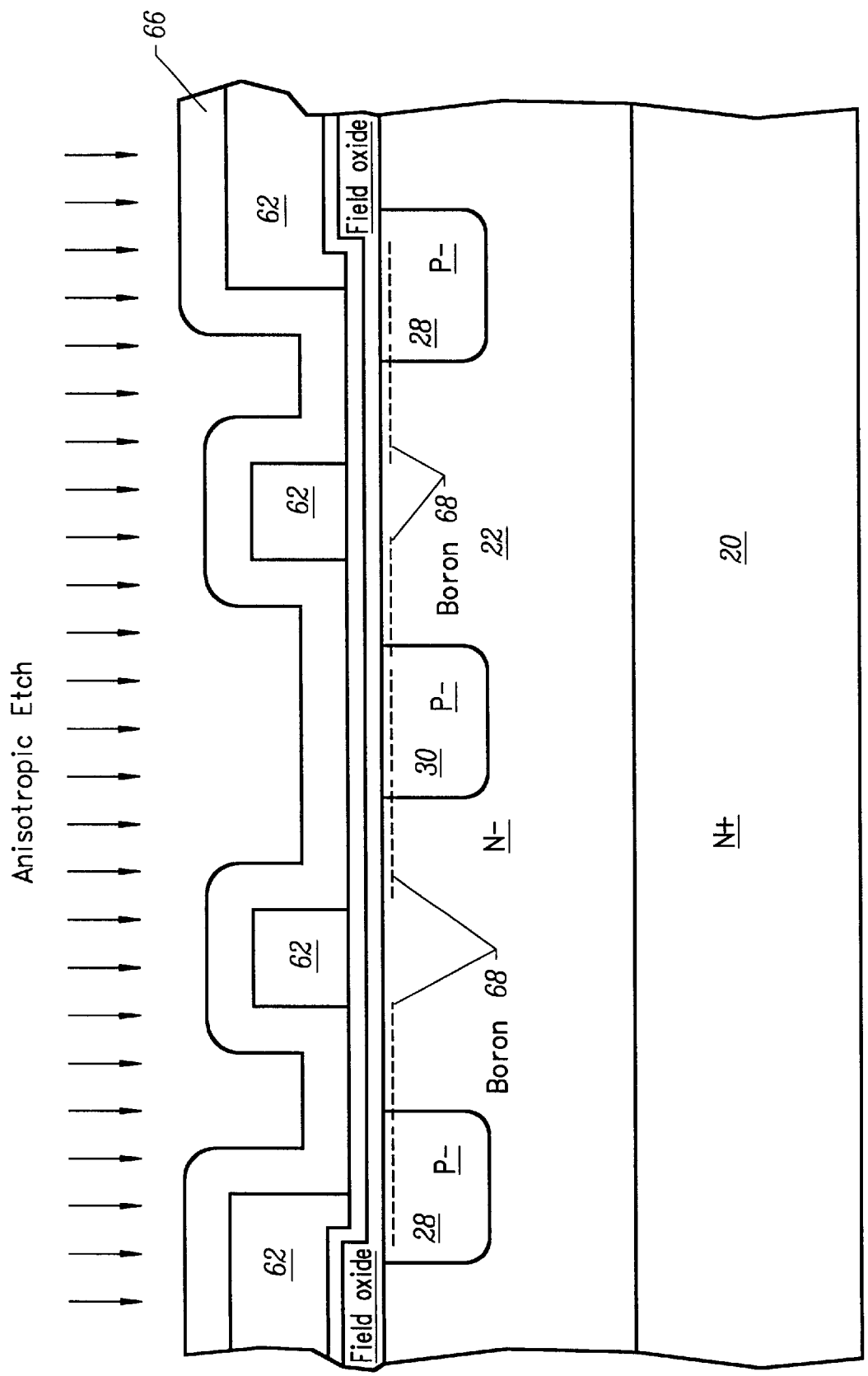
Figure 13:
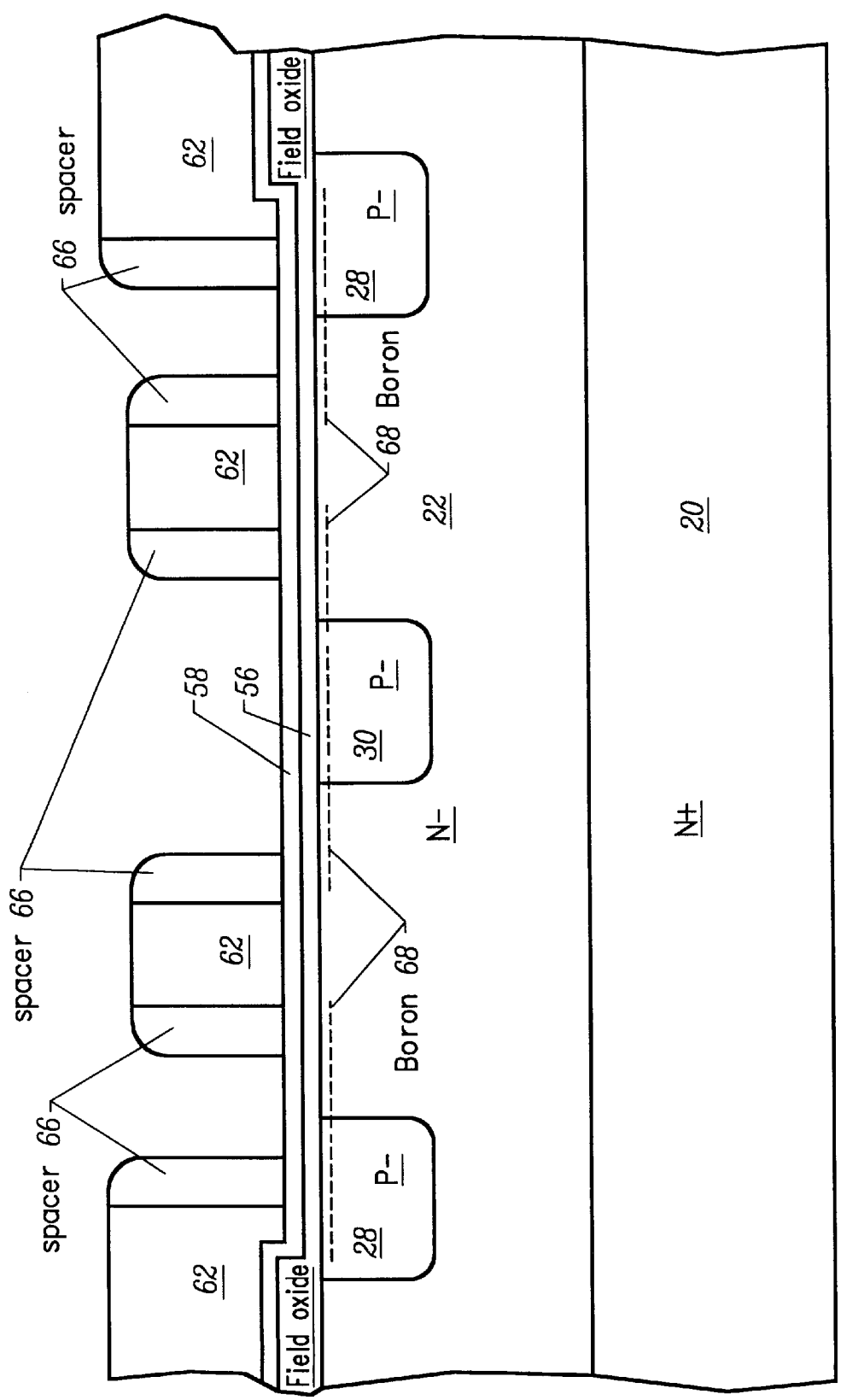
Figure 14:
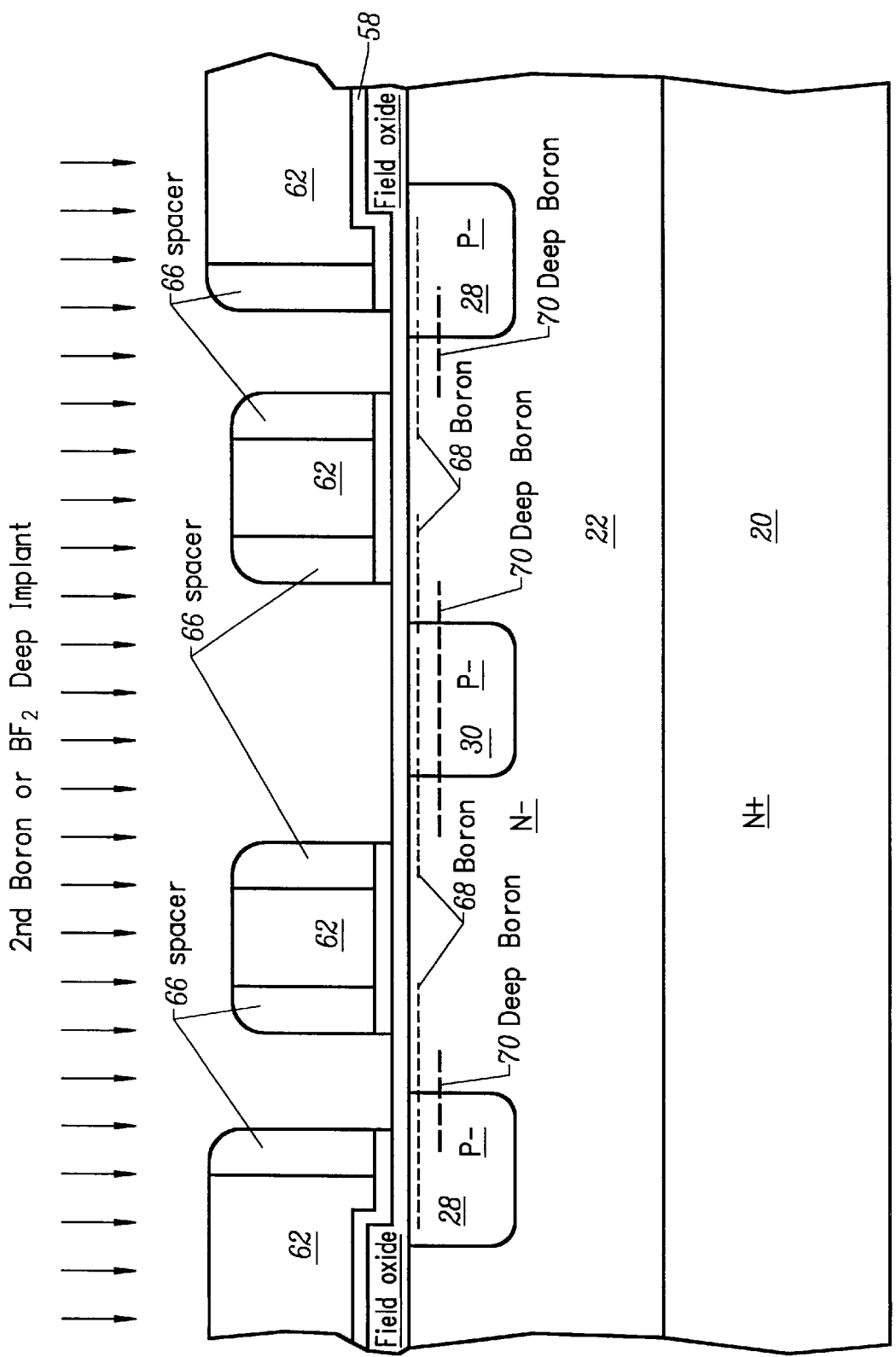

Thereafter, the photoresist 64 is removed, and a 150–500 nm insulator 66 of silicon oxide or silicon nitride is deposited as shown in FIG. 12. An anisotropic etch of the deposited layer 66 forms sidewall spacers 66 on the oxide pedestal 62 as shown in FIG. 13. A portion of polysilicon 58 not covered is then removed by etching. A second boron or $BF_2$, implant of boron ions 70 is then implemented at a dose on the order of $E13–E14/cm^2$ with an energy of 50–150 KeV, as shown in FIG. 14. The implant can be before the polysilicon etch.

Figure 1:
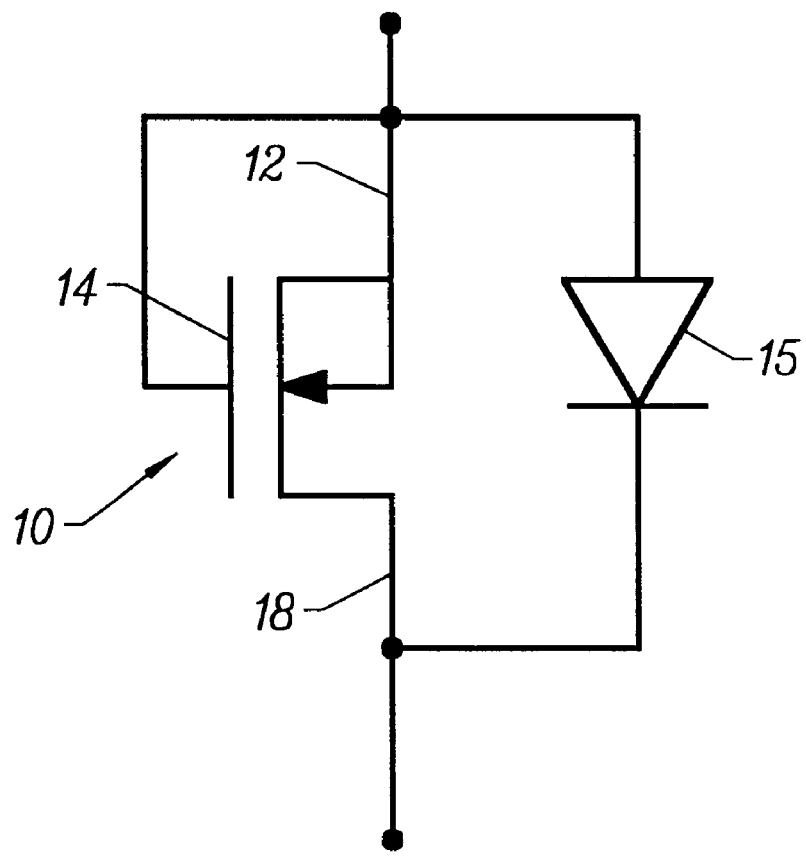
FIG. 1 is an electrical schematic of a power rectifier device to which the invention applies.
Figure 2:
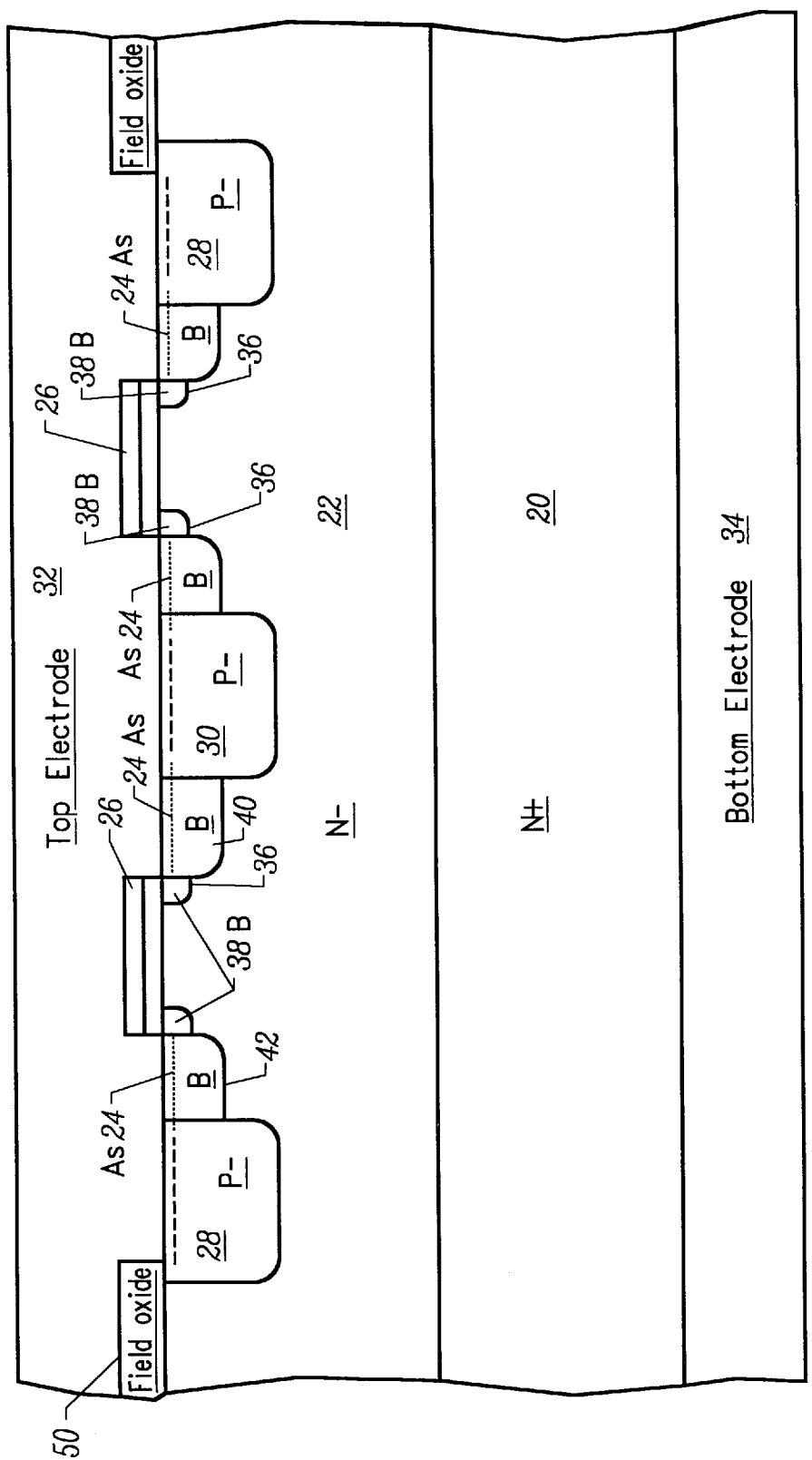
FIG. 2 is a section view of a power rectifier device in accordance with copending application Ser. No. 09/544,730 and Ser. No. 14987-000700US.
Figure 3:
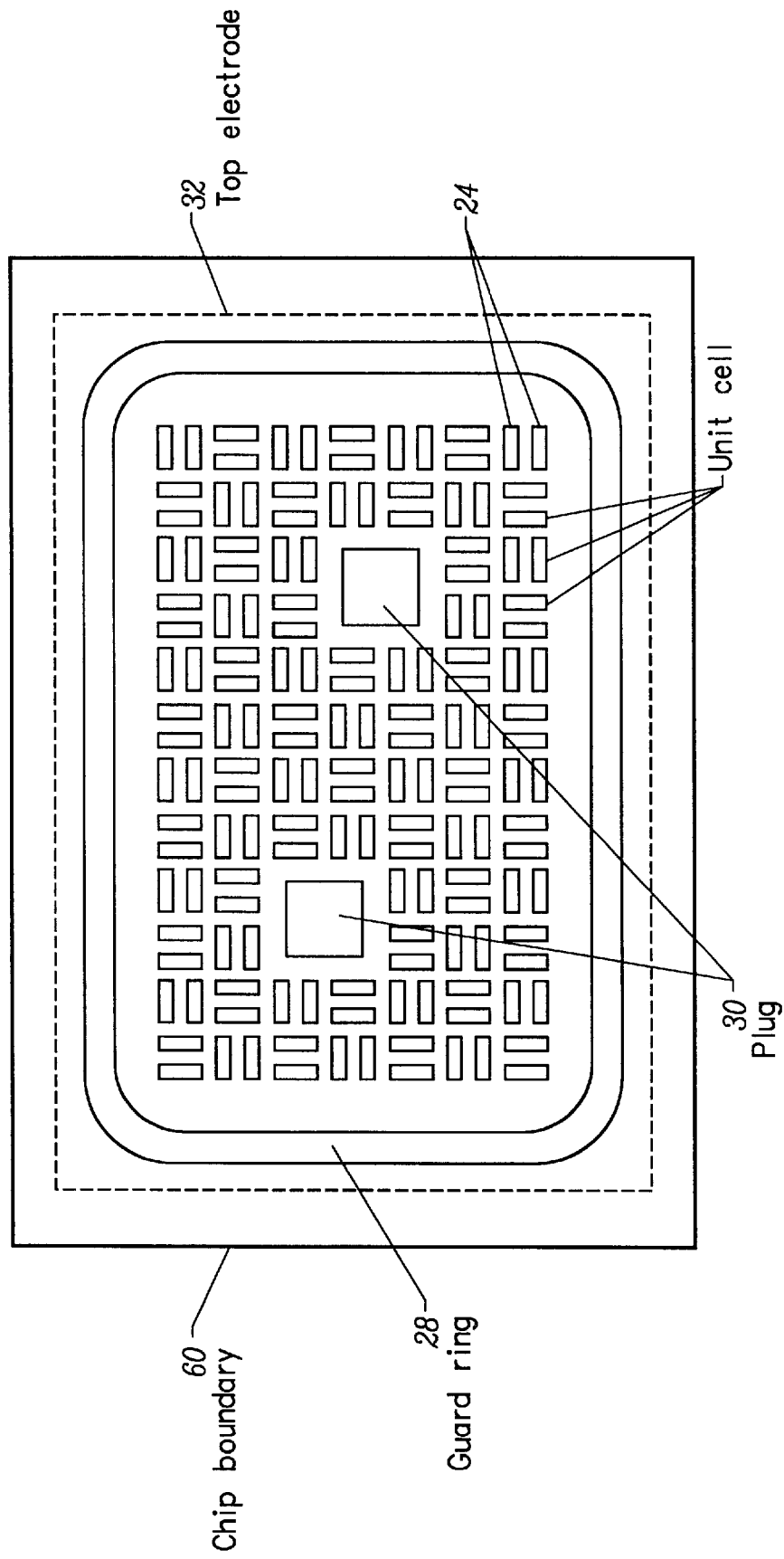
FIG. 3 is a plan view of the power rectifier device of FIG. 2.
Figure 15:
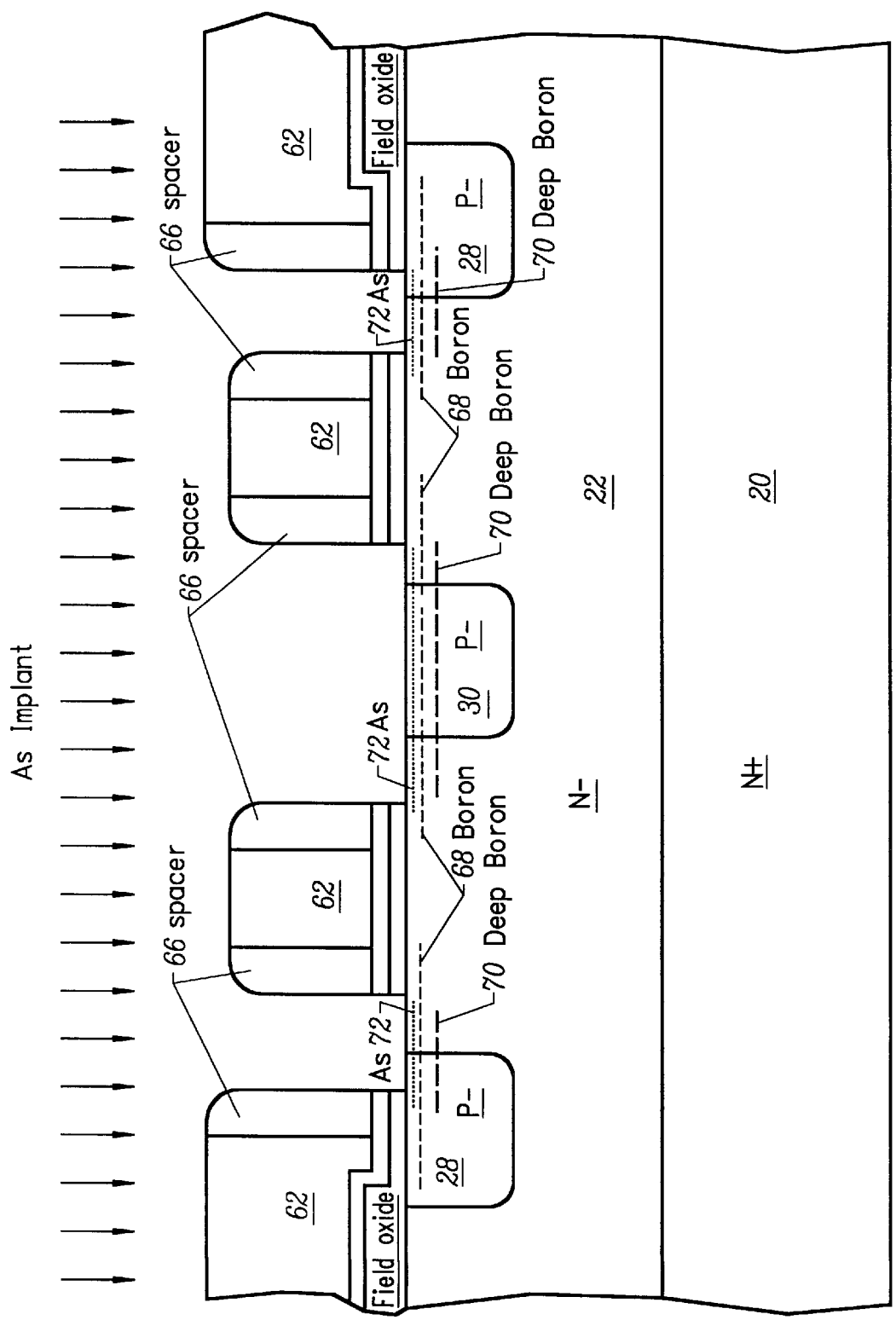
Figure 16:
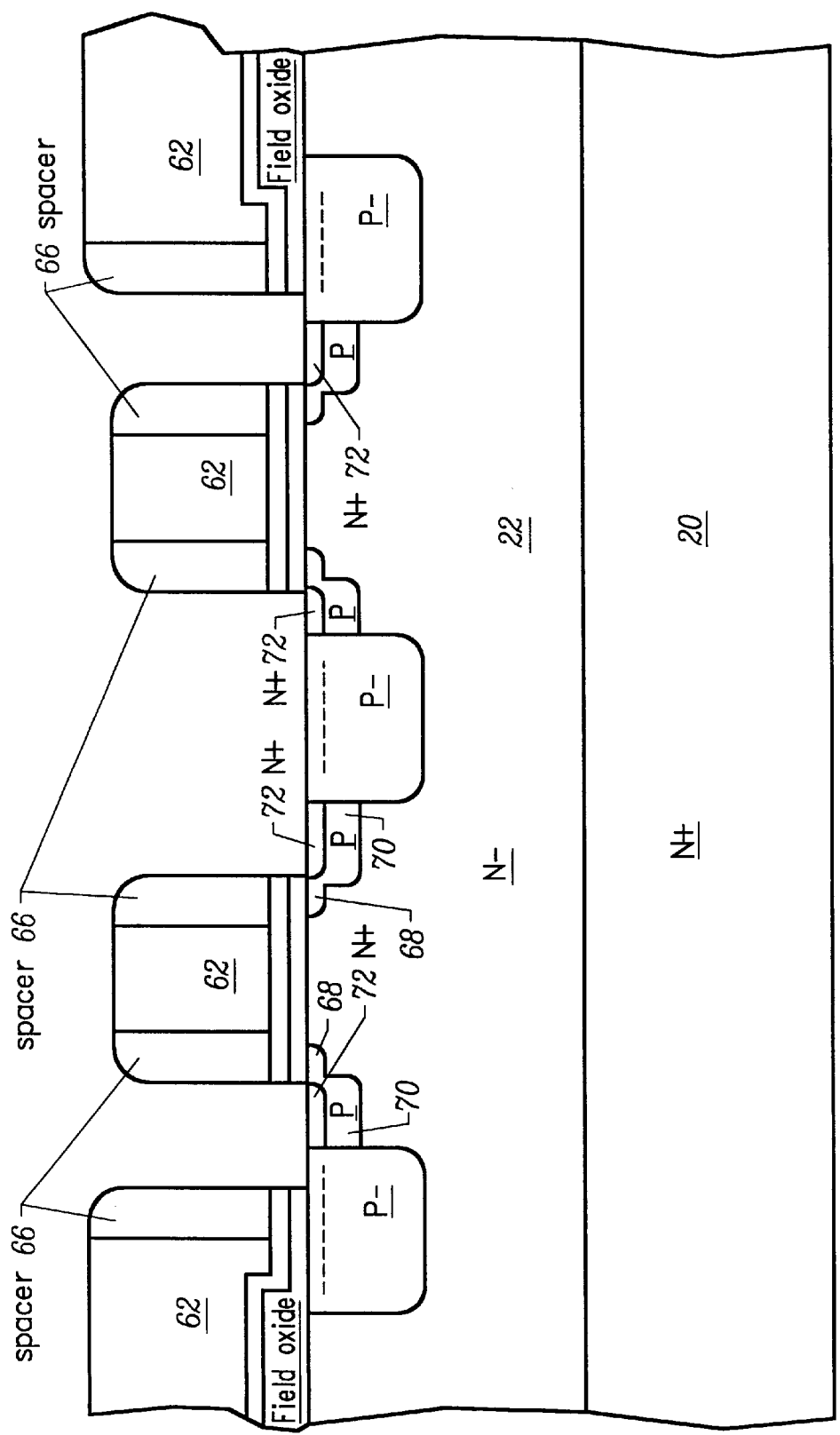
Figure 17:
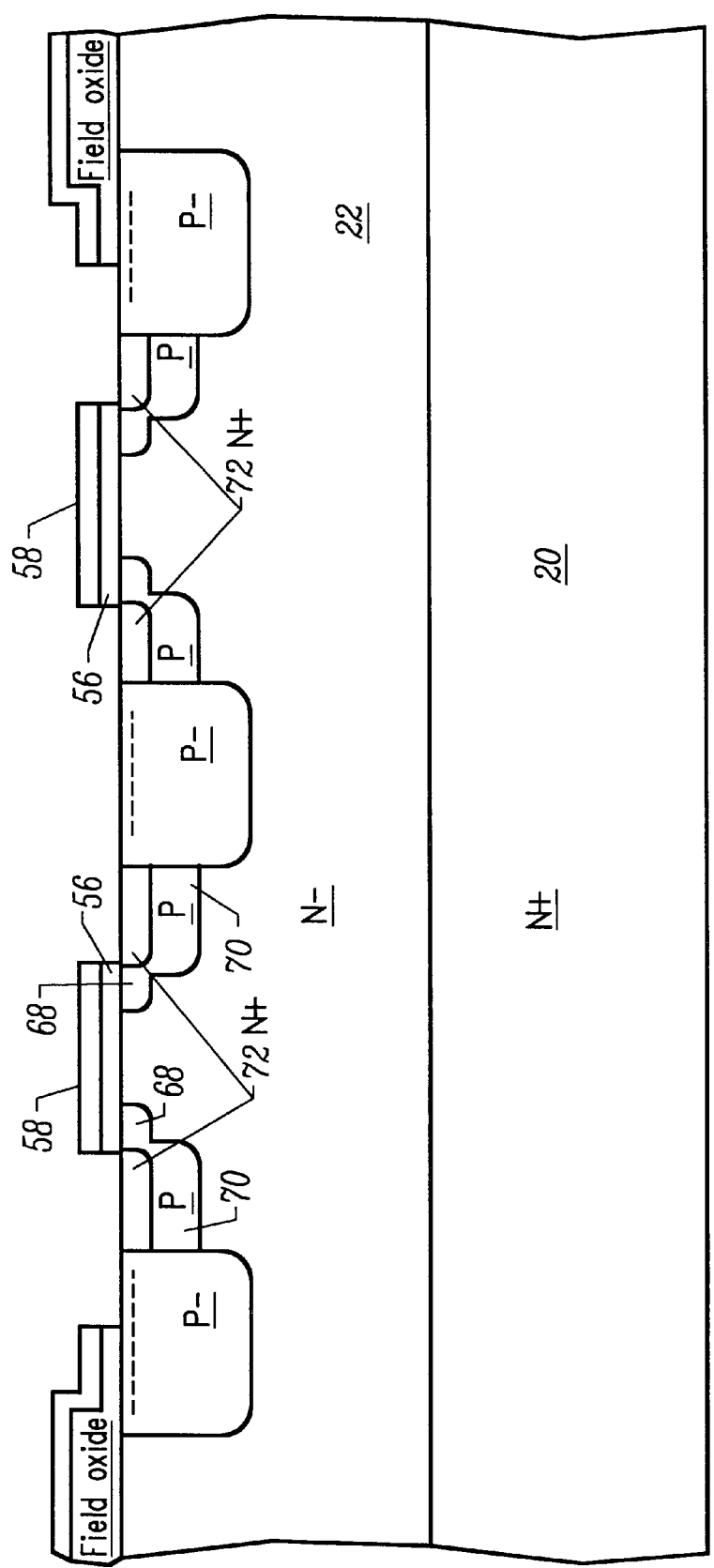
Figure 19:
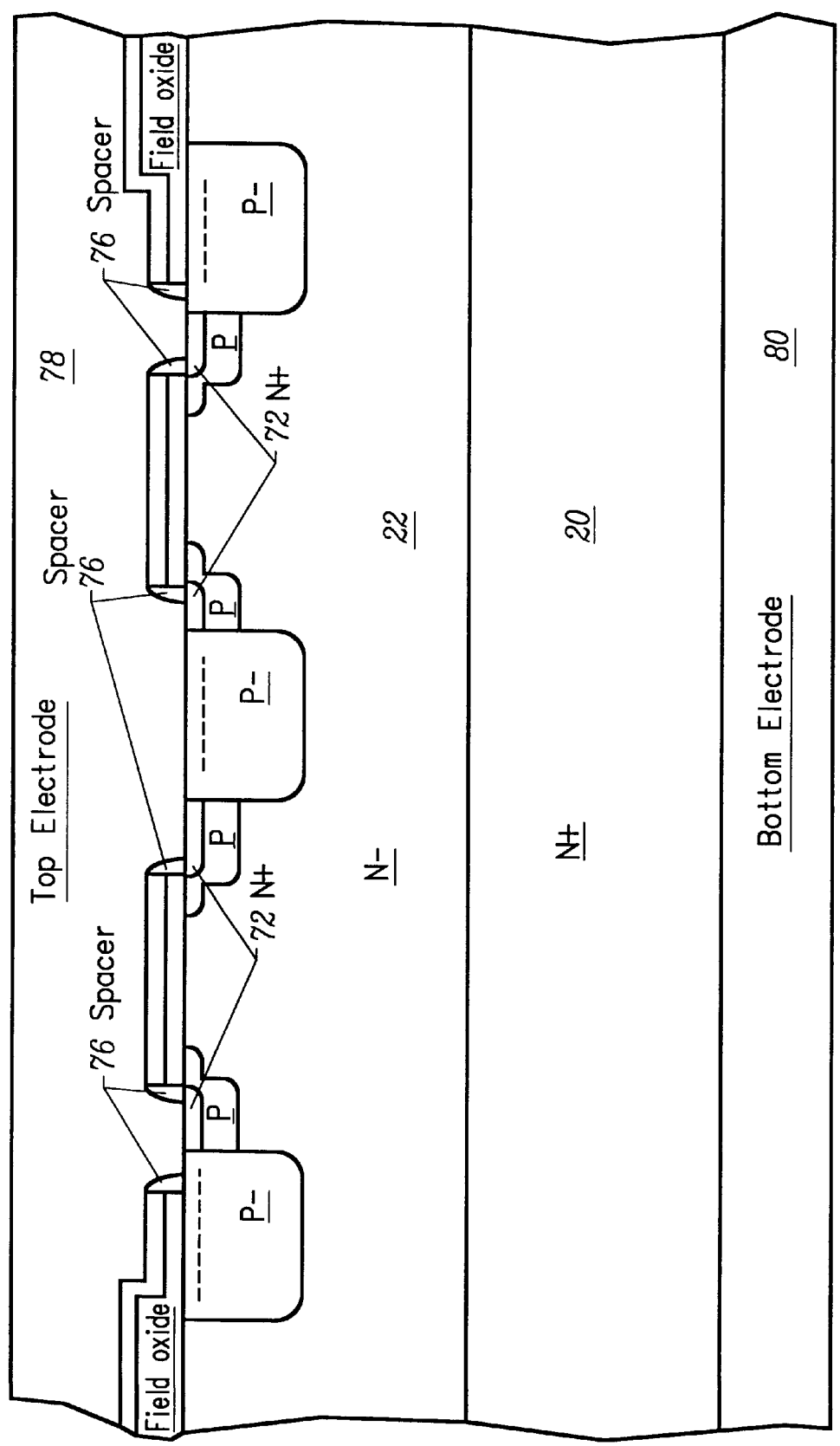

Thereafter, as shown in FIG. 15 the exposed silicon oxide 56 is removed, and arsenic or phosphorus is implanted with a dose of $E13–E16/cm^2$ at an energy of 10–60 KeV to, form the N–doped source/drain regions 24 (see FIG. 2). A photoresist mask can be provided before the arsenic or phosphorus implant to shield the boron doped regions formed in FIGS. 5 and 6. In FIG. 16 rapid thermal annealing is employed to activate all implants and form the source and body regions such as P-region 70 and N+ region 72. Separate rapid thermal annealing can be preformed after each individual implant step as an alternative. Next as shown in FIG. 17 the spacers 66 and pedestals 62 are removed preferably by an anisotropic dry etch, and then a 10–70 nm layer such as silicon oxide, silicon nitride, or polysilicon, is deposited and anisotropically etched to form spacers 74 in FIG. 18. The use of spacers 74 is optional in providing a barrier between the top metal electrode and the channel region under the gate structures as shown in FIG. 19. In forming top electrode 78 and bottom electrode 80, a metal such as Ti, TiN, TiW, Ni, Ag, Au, Cu, Al, or a combination of two or more metals is deposited and annealed to form good ohmic contacts.

The described process of FIGS. 4–19 form the gate oxide and gate early in the process and eliminate photoresist masking steps, which is advantageous in using older semiconductor processing equipment. The following steps 17–19 can be replaced by steps 17A–20A in the formation of protection spacers.

Figure 17A:
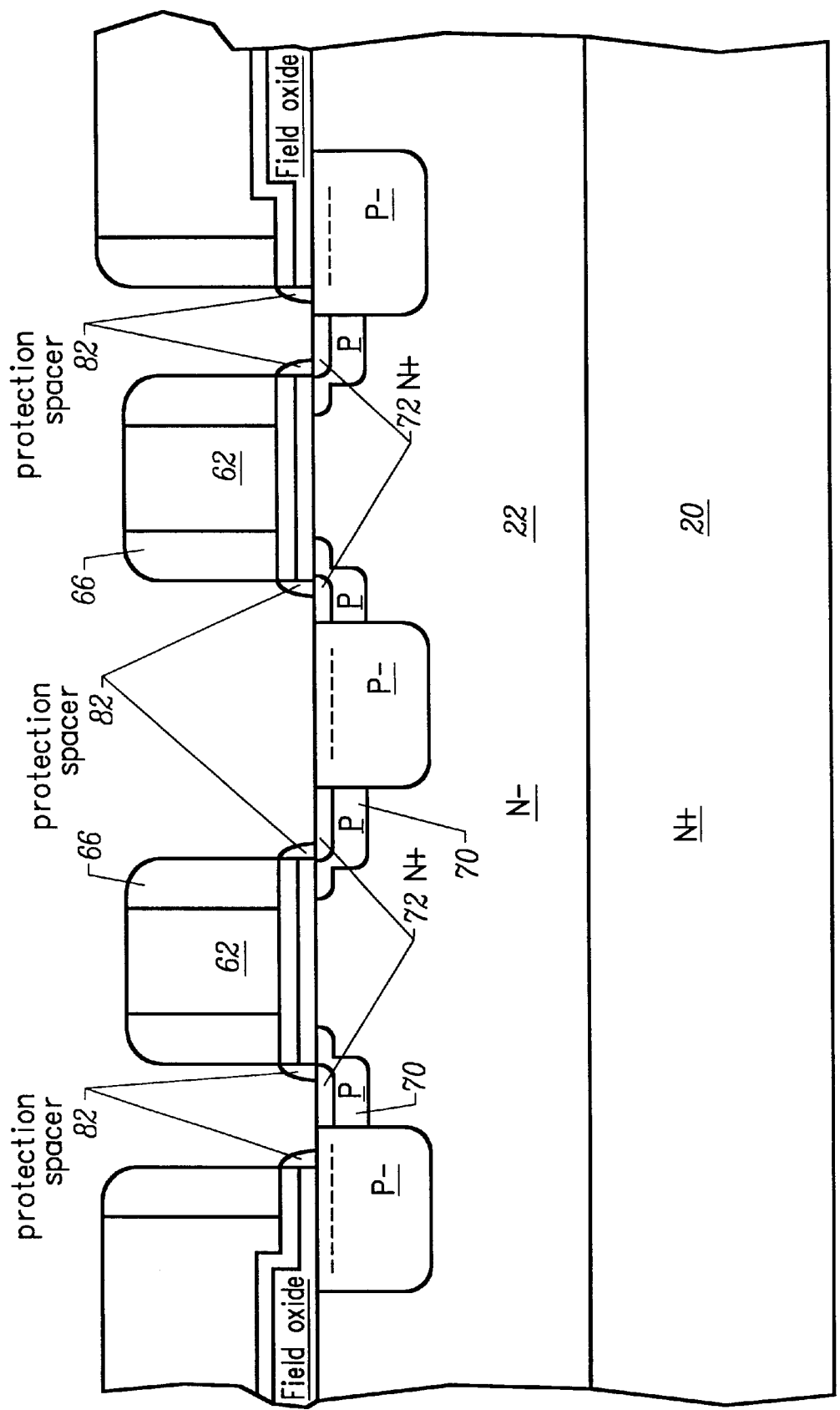
Figure 18:
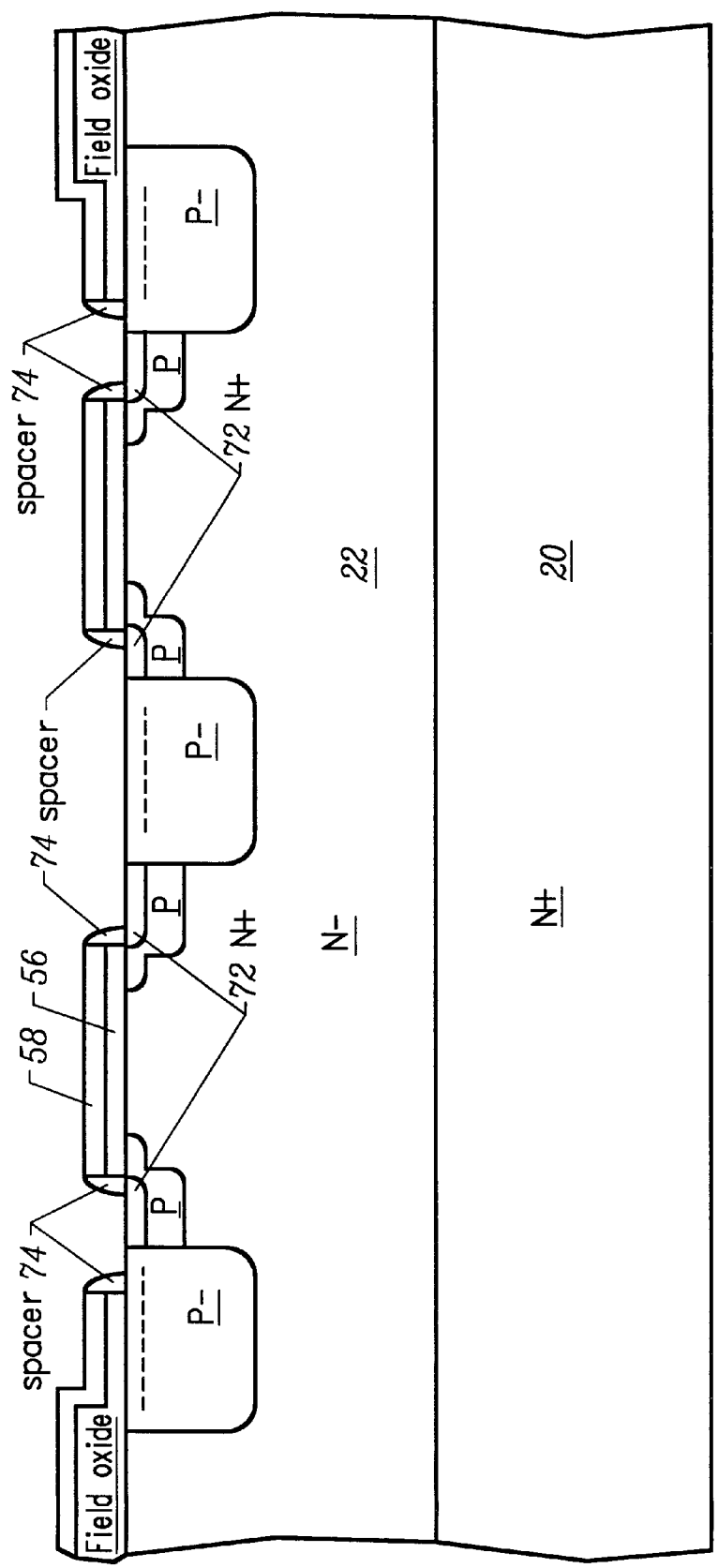
Figure 18A:
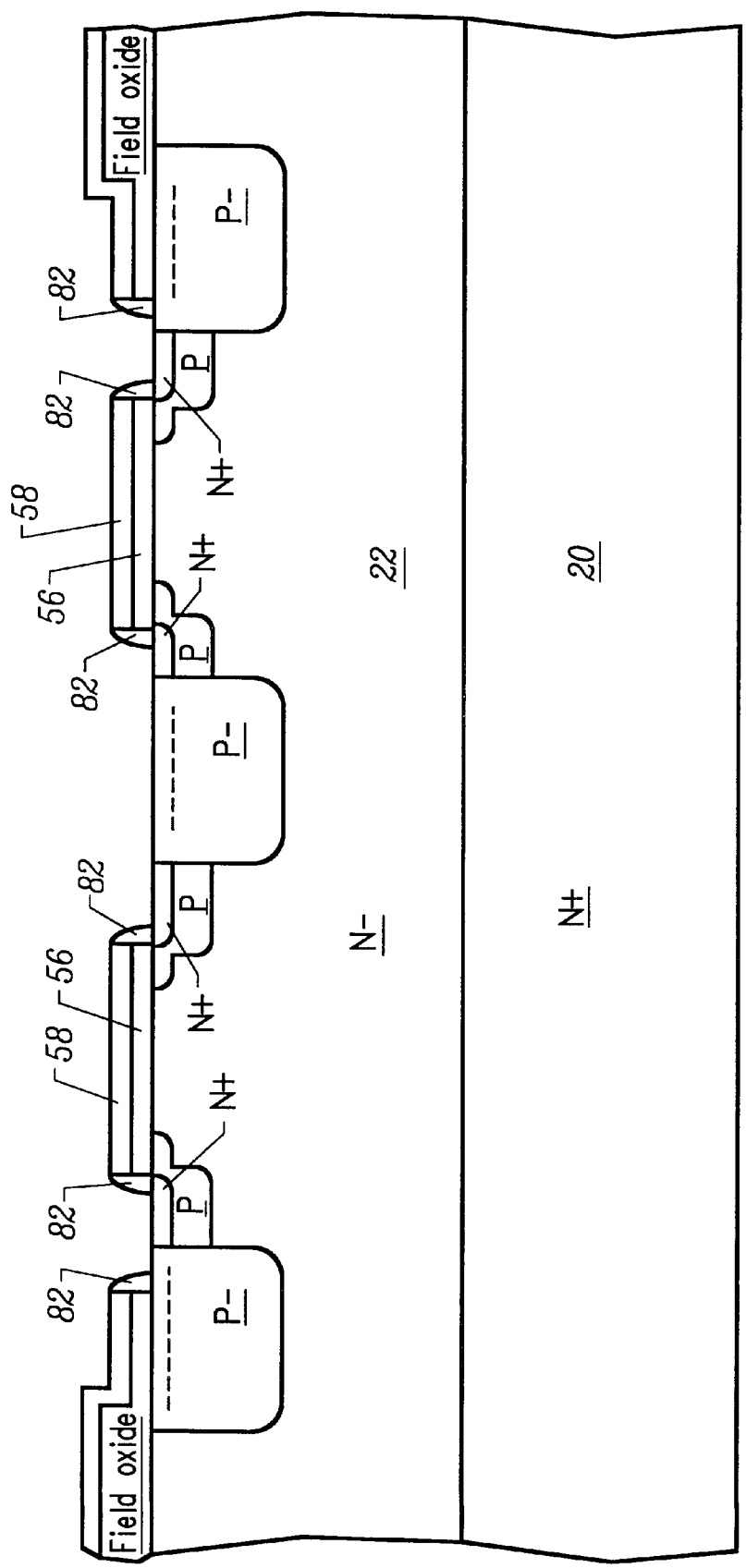

In FIG. 17A, a 10–70 nm layer such as silicon nitride or polysilicon, is deposited and then anisotropically etched to form protection spacers 82 on the sides of the gate structures. Thereafter as shown in FIG. 18A spacers 66 and pedestals 62 are removed by a wet chemical etch which does not effect the gate oxide 56 and the gate structures.

Figure 19A:
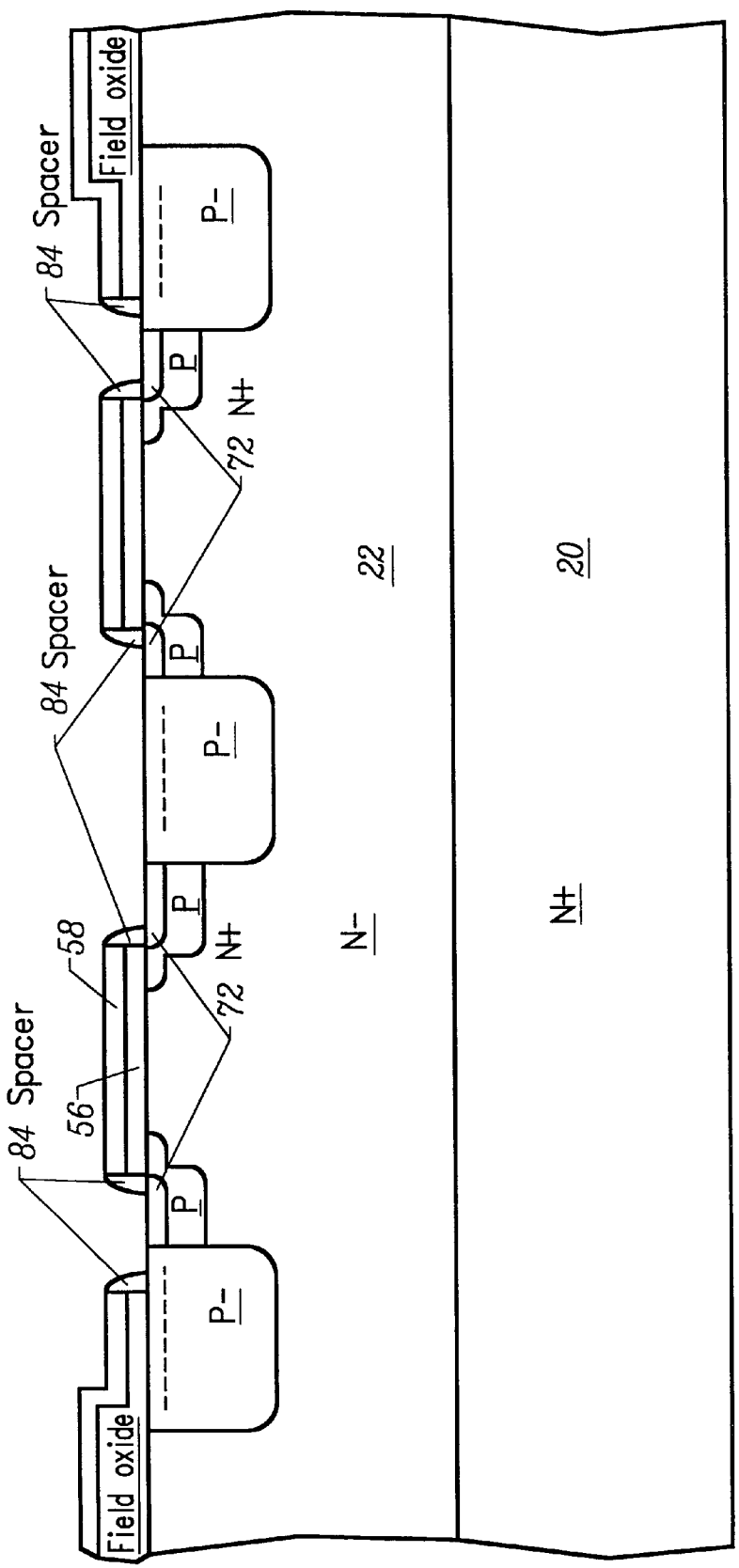
Figure 20A:
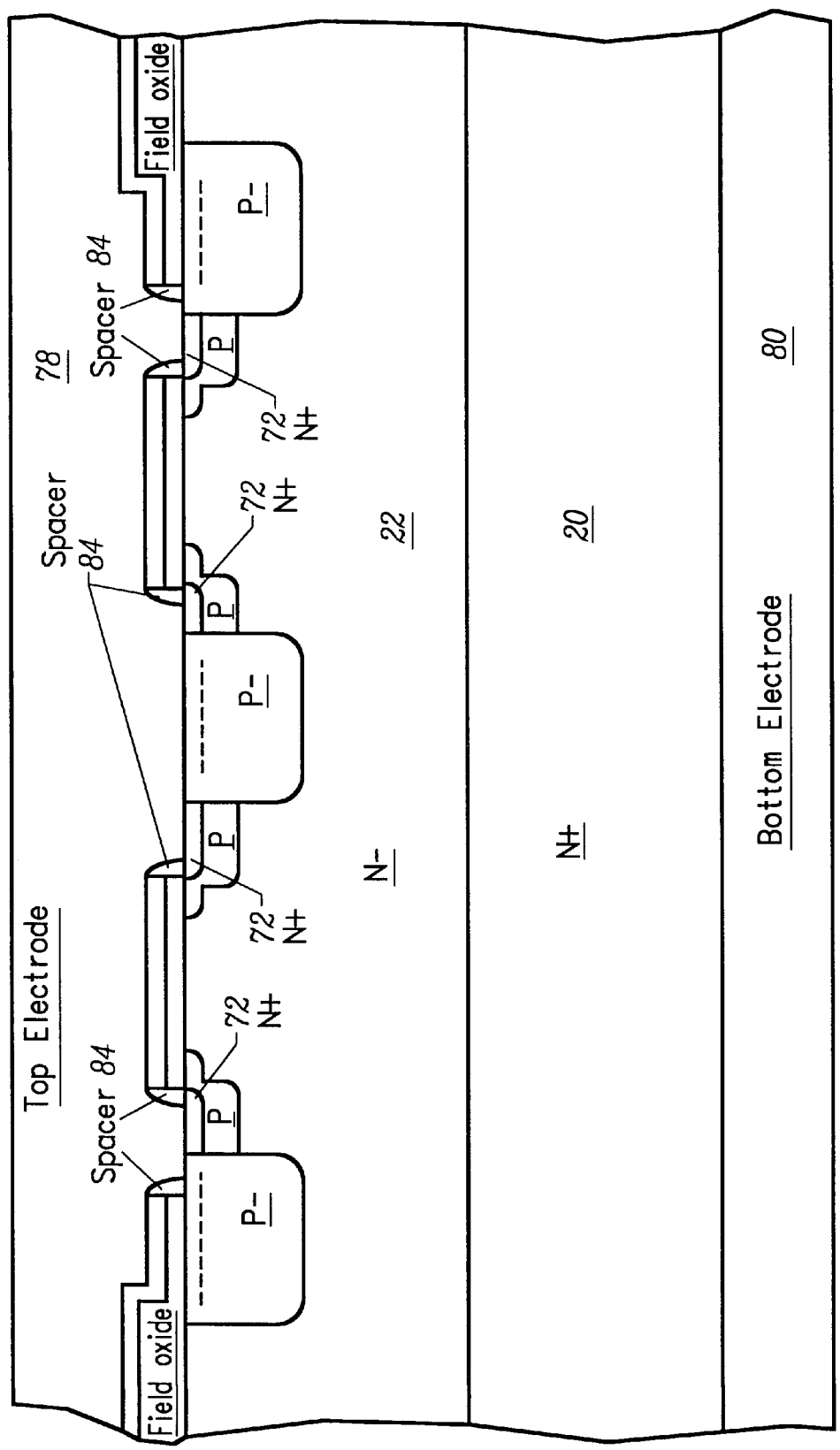

As shown in FIG. 19A, protection spacers 82 are removed, and a 10–70 nm layer such as such as silicon oxide, silicon nitride or polysilicon is deposited and anisotropically etched to form new spacers 84 to protect the sides of the gate structure. Formation of spacers 84 is not necessary if the protection spacers 82 have a proper height of protecting the gate structures. Finally, the device is completed in FIG. 20A with the formation of top electrode 78 and bottom electrode 80 as shown in FIG. 19.

In the above embodiments of the invention a polysilicon gate is employed. A metal gate structure can be implemented by replacing the steps illustrated in FIGS. 9–19 with the steps illustrated in FIGS. 21–31.

Figure 21:
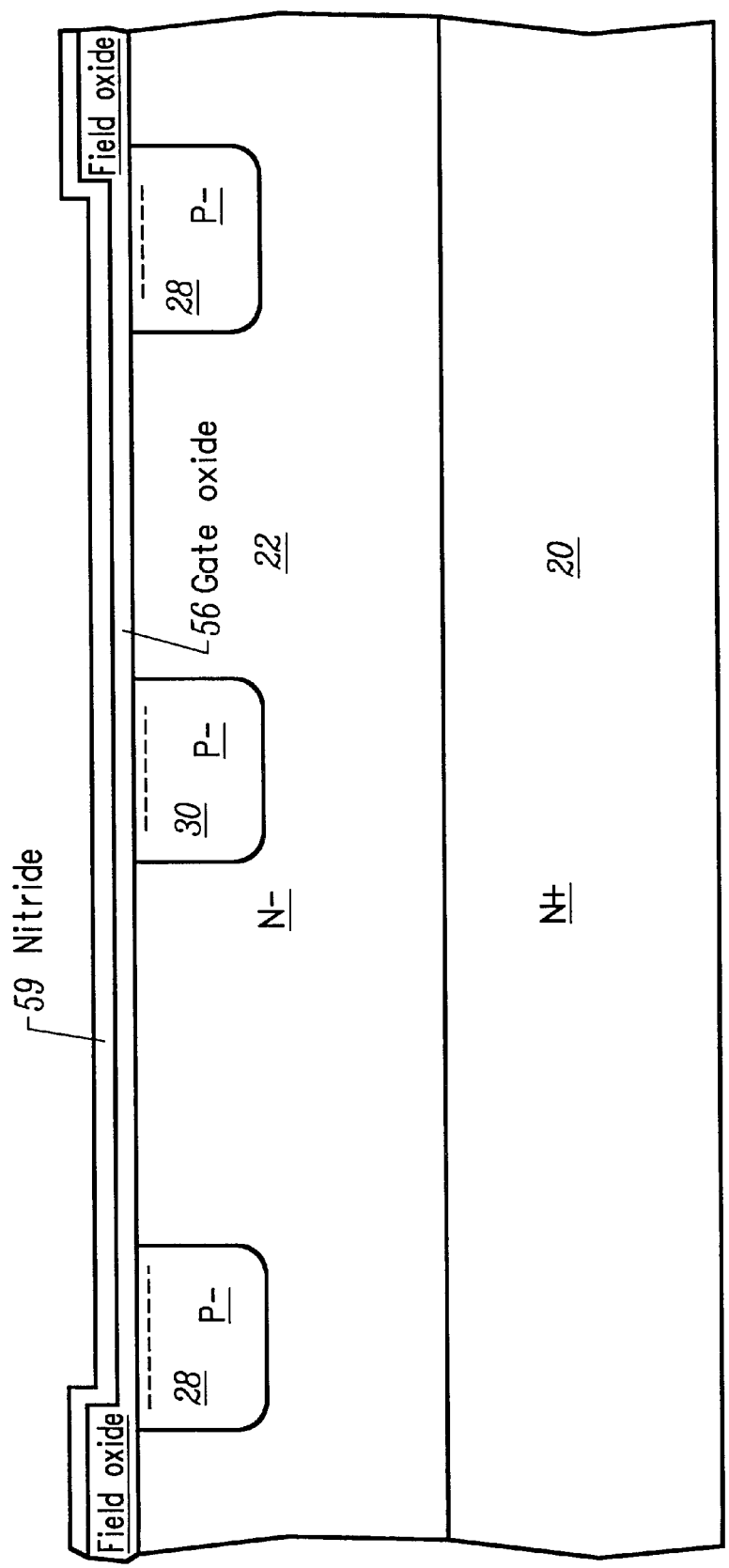
FIGS. 21–31 are section views illustrating alternative steps in the process of FIGS. 4–19 in accordance with another embodiment of the invention.
Figure 22:
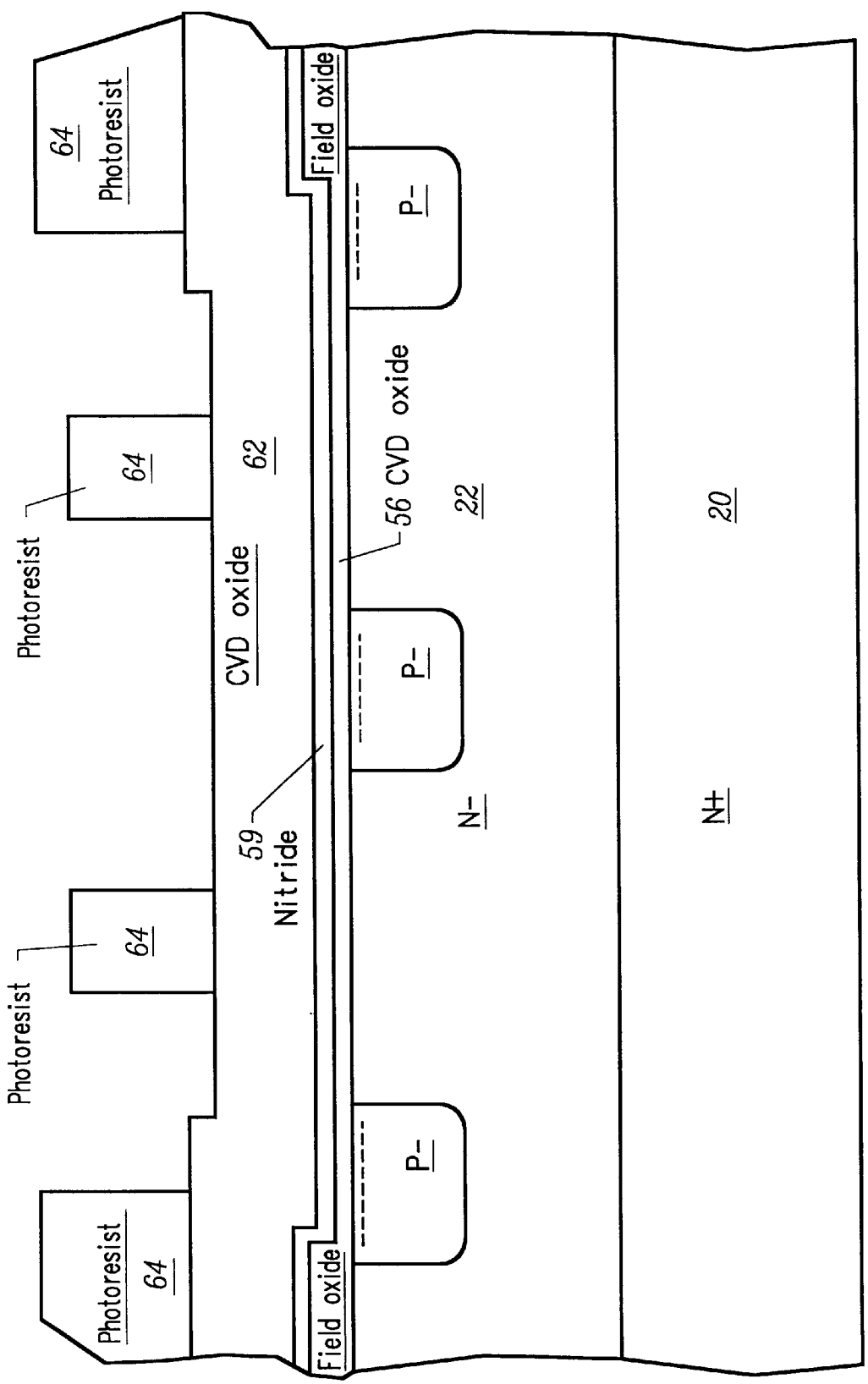

In FIG. 21, the photoresist 54 from FIG. 8 is removed and 5–50 nm gate oxide 56 is grown and then 5–80 nm of silicon nitride 59 is deposited. Thereafter, as shown in FIG. 22 a layer 62 of 200–1200 nm deposited silicon oxide is made, and then photoresist pattern 64 is used to define MOS transistor units.

Figure 23:
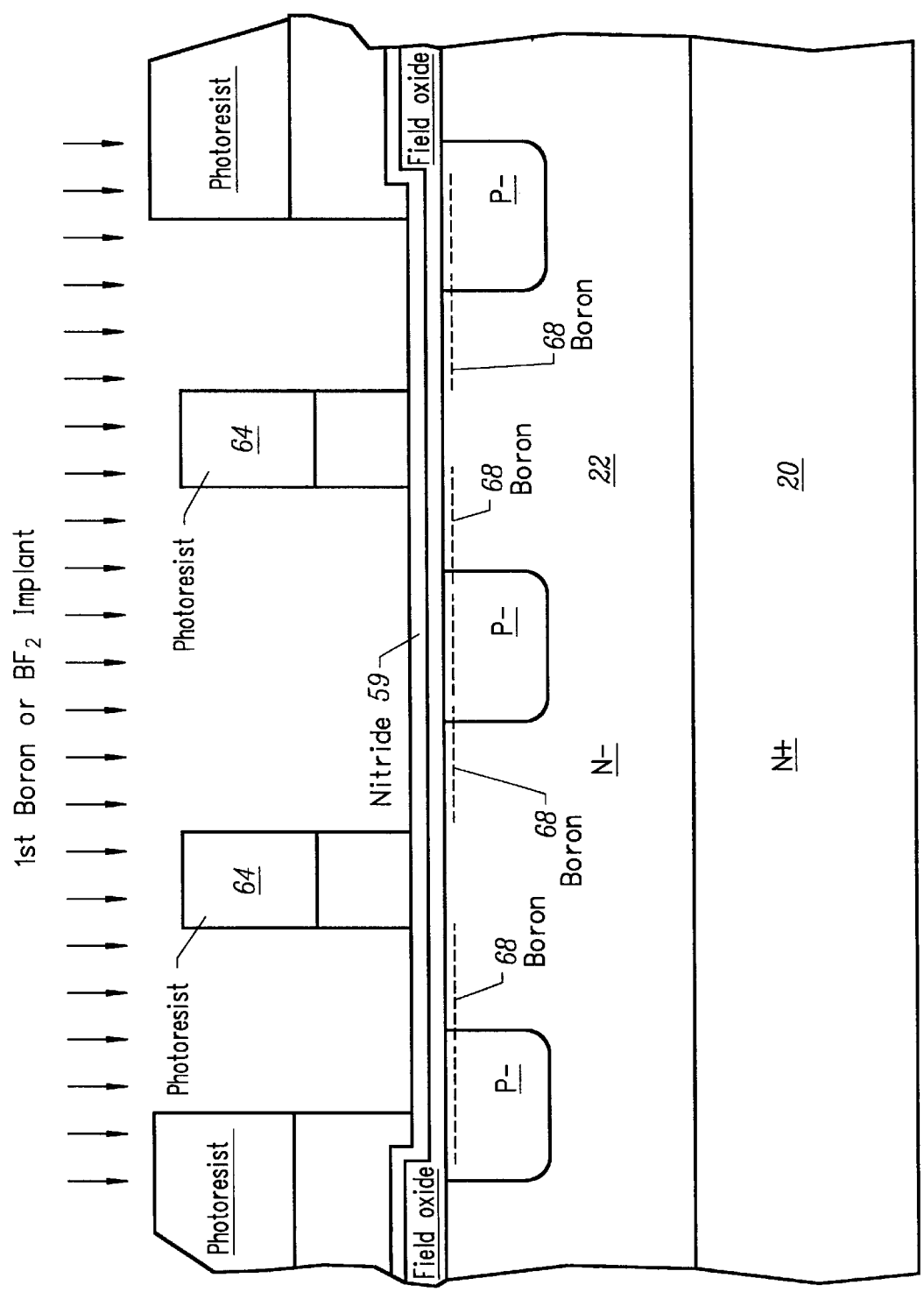

FIG. 23 is similar to FIG. 11 in anisotropically etching to define pedestals 62, which is followed by a first boron or $BF_2$ implant of boron ions 68 in epitaxial layer 22. The first boron implant can be performed after a photoresist removal as an alternative.

Figure 24:
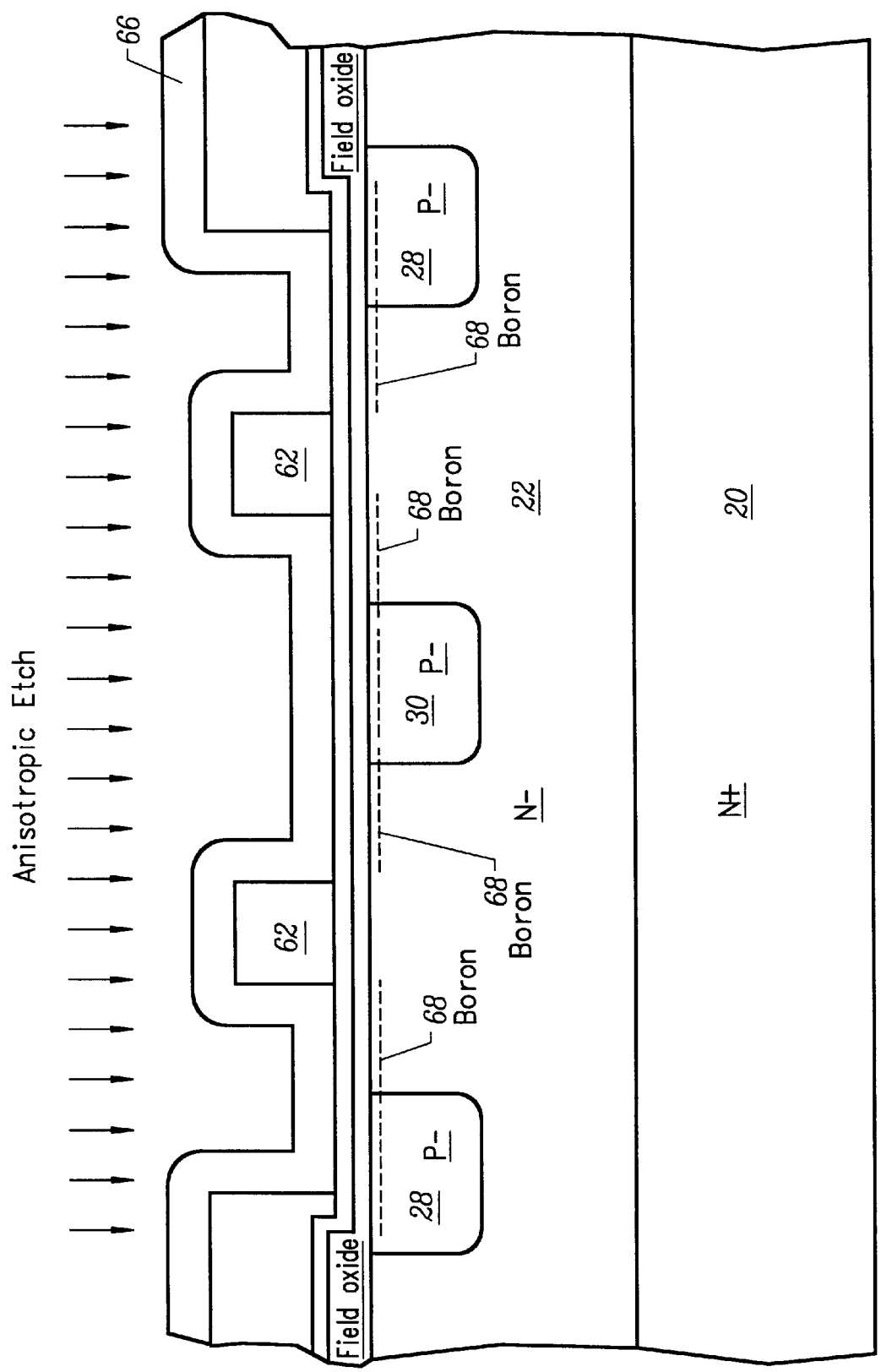
Figure 25:
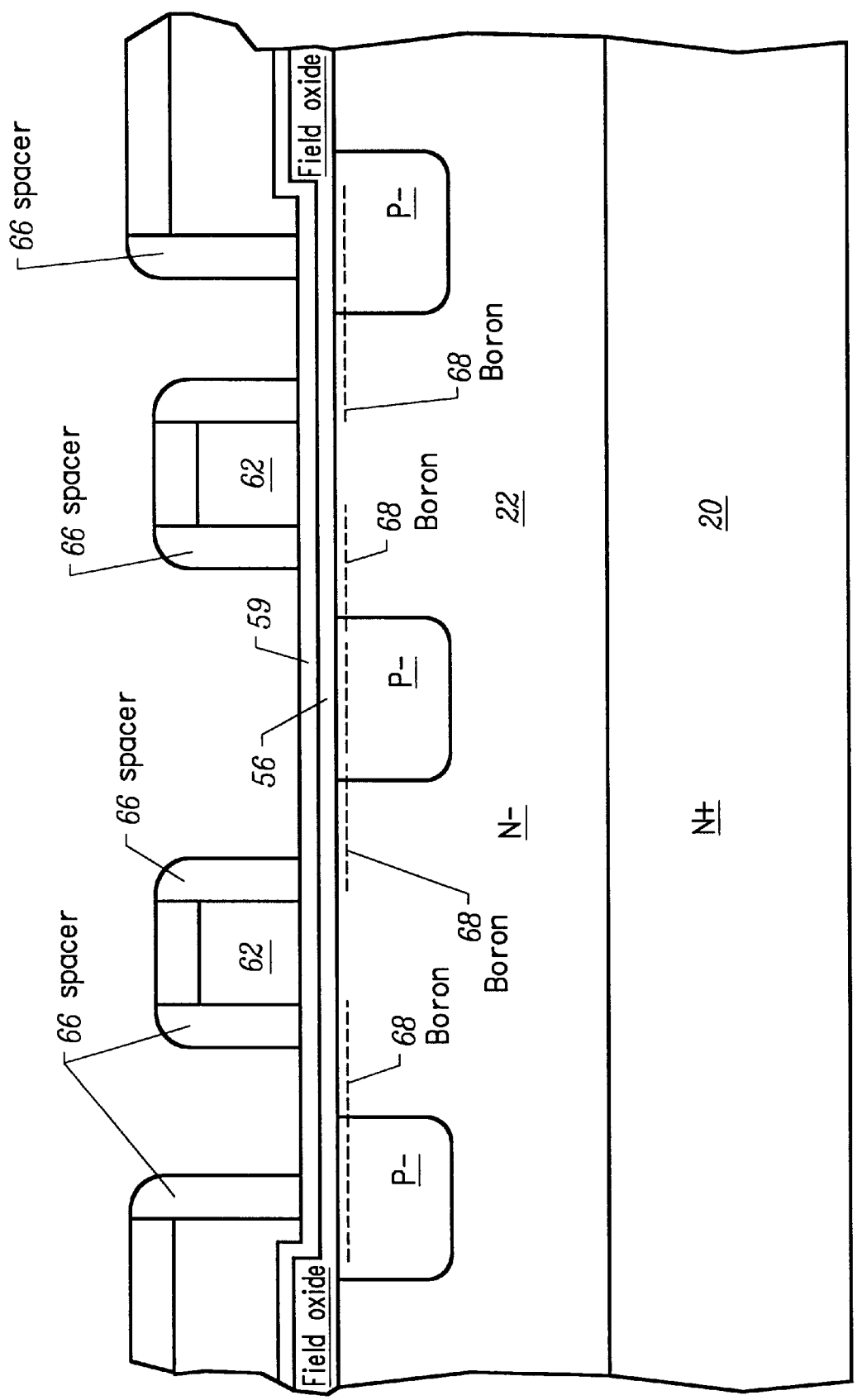
Figure 26:
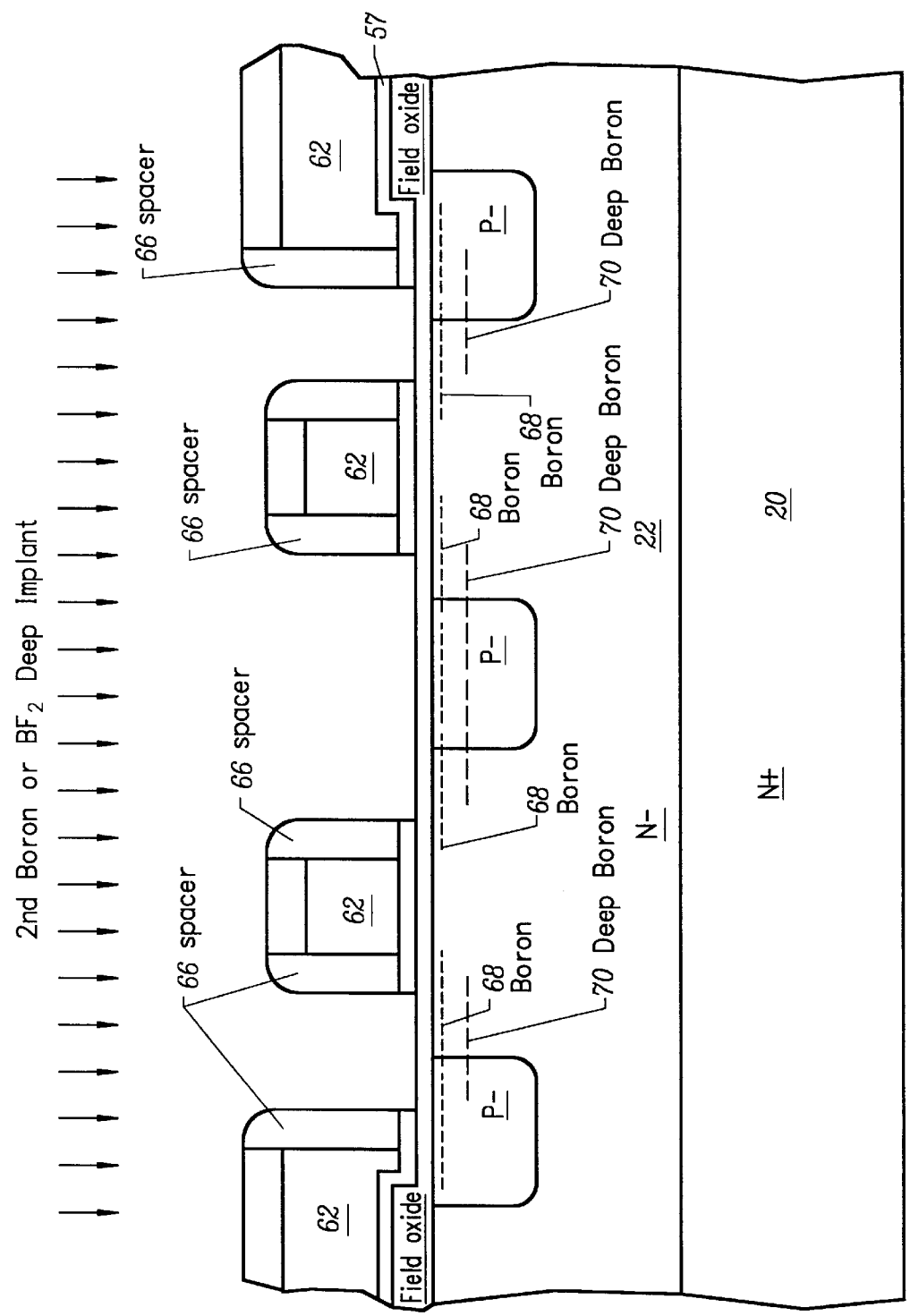
Figure 27:
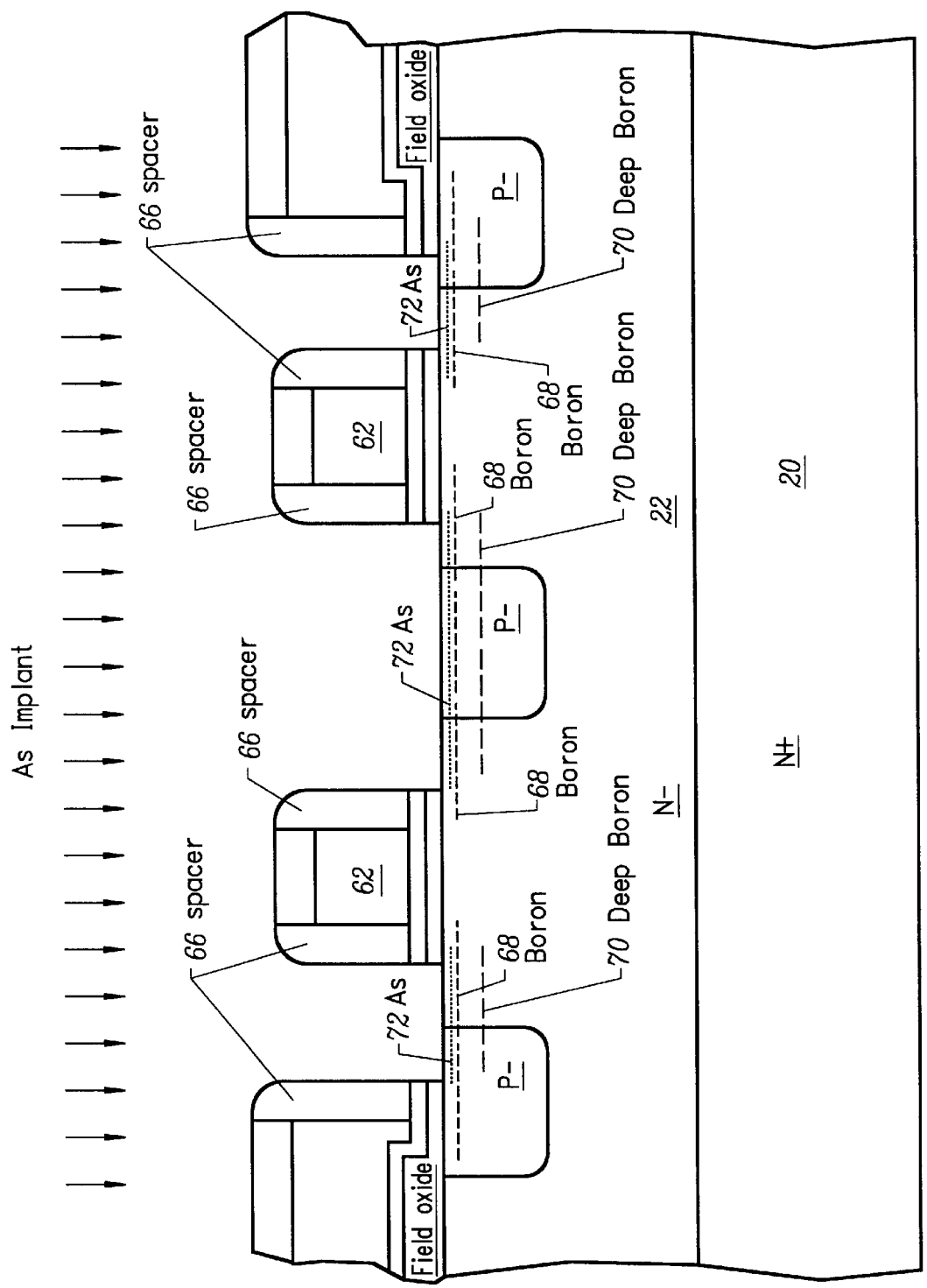
Figure 28:
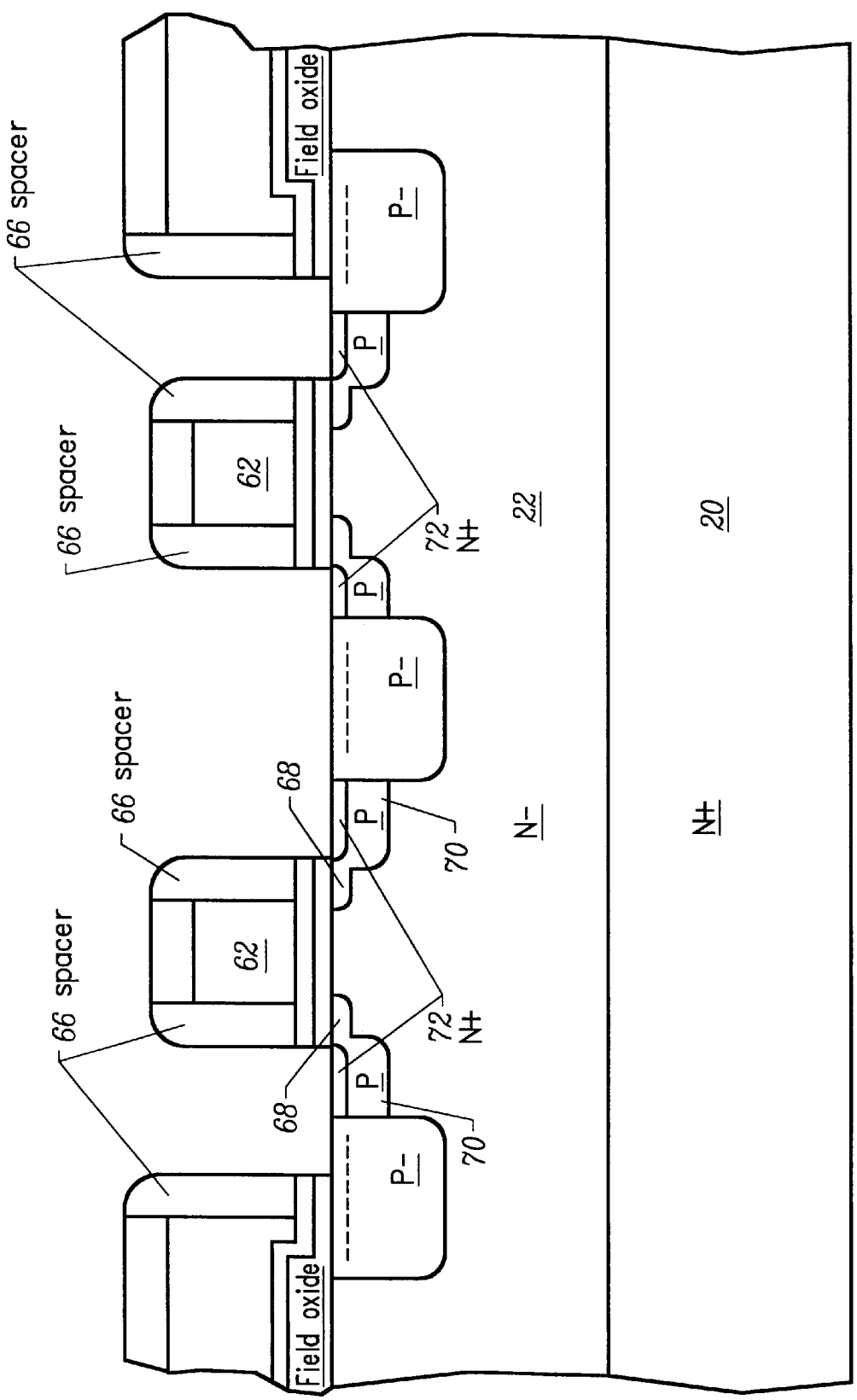
Figure 28A:
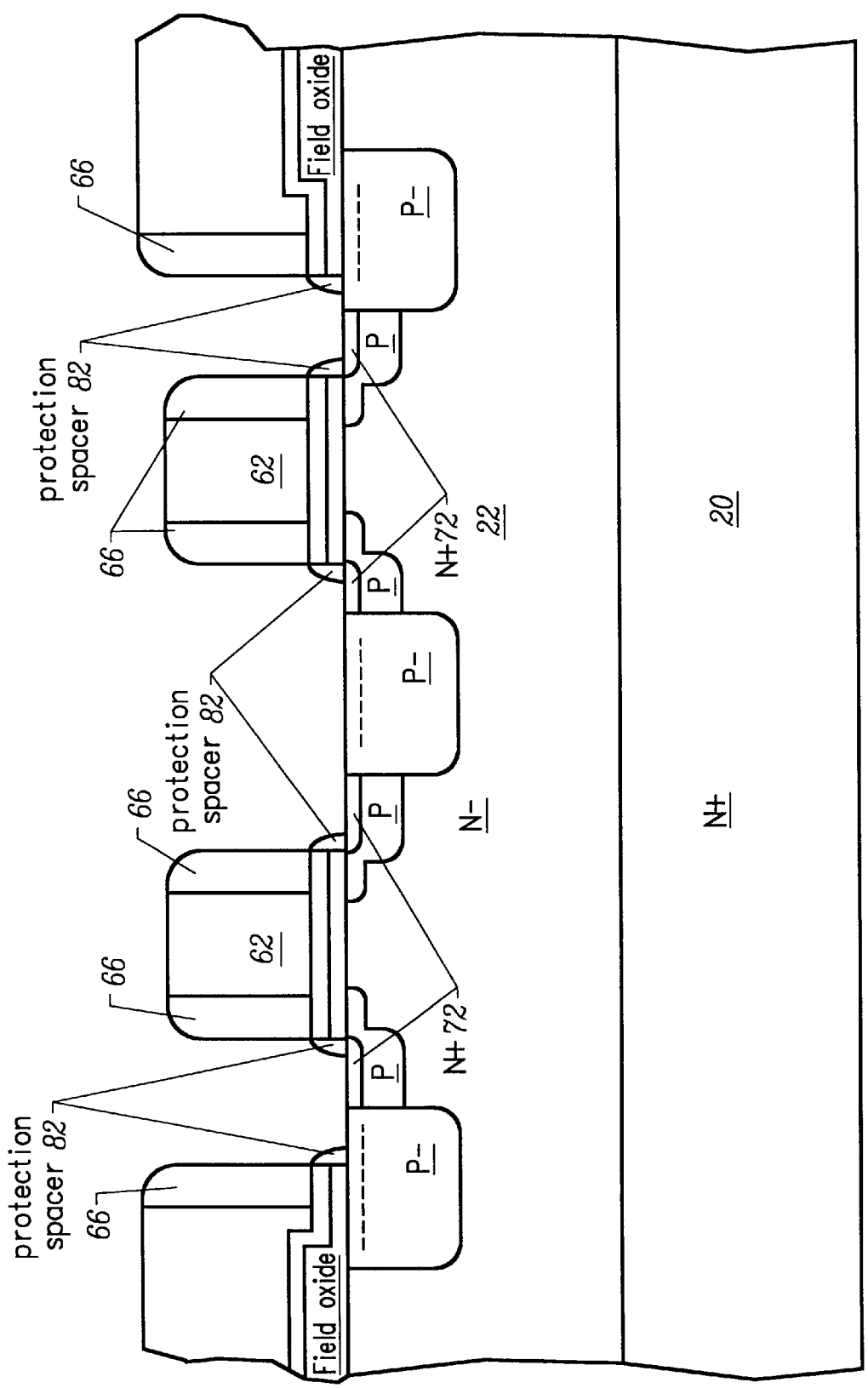

FIG. 24 is similar to FIG. 12 in depositing 150–500 nm insulator 66 such as silicon oxide or silicon nitride, which is followed by anisotropic etch to form the sidewall spacers 66 as shown in FIG. 25. Thereafter, in FIG. 26 the exposed silicon nitride 59 is removed and a second boron or $BF_2$ implant forms deep boron ions 70 within epitaxial layer 22, similar to the process step shown in FIG. 14. In FIG. 27 the exposed silicon oxide 56 is removed by etch, and arsenic is implanted at 72, similar to the process in FIG. 15. In FIG. 28 rapid thermal annealing activates all implants to form source and body regions 68, 70, 72, similar to the process in FIG. 16. As an alternative process step, protection spacers 82 can be formed as illustrated in FIG. 28A by depositing 10–70 nm layer of silicon nitride or polysilicon and anisotropically etching the deposited layer. This protection spacer formation step is not necessary if the following spacer pedestal removal is preformed by anisotropic dry etch.

Figure 29:
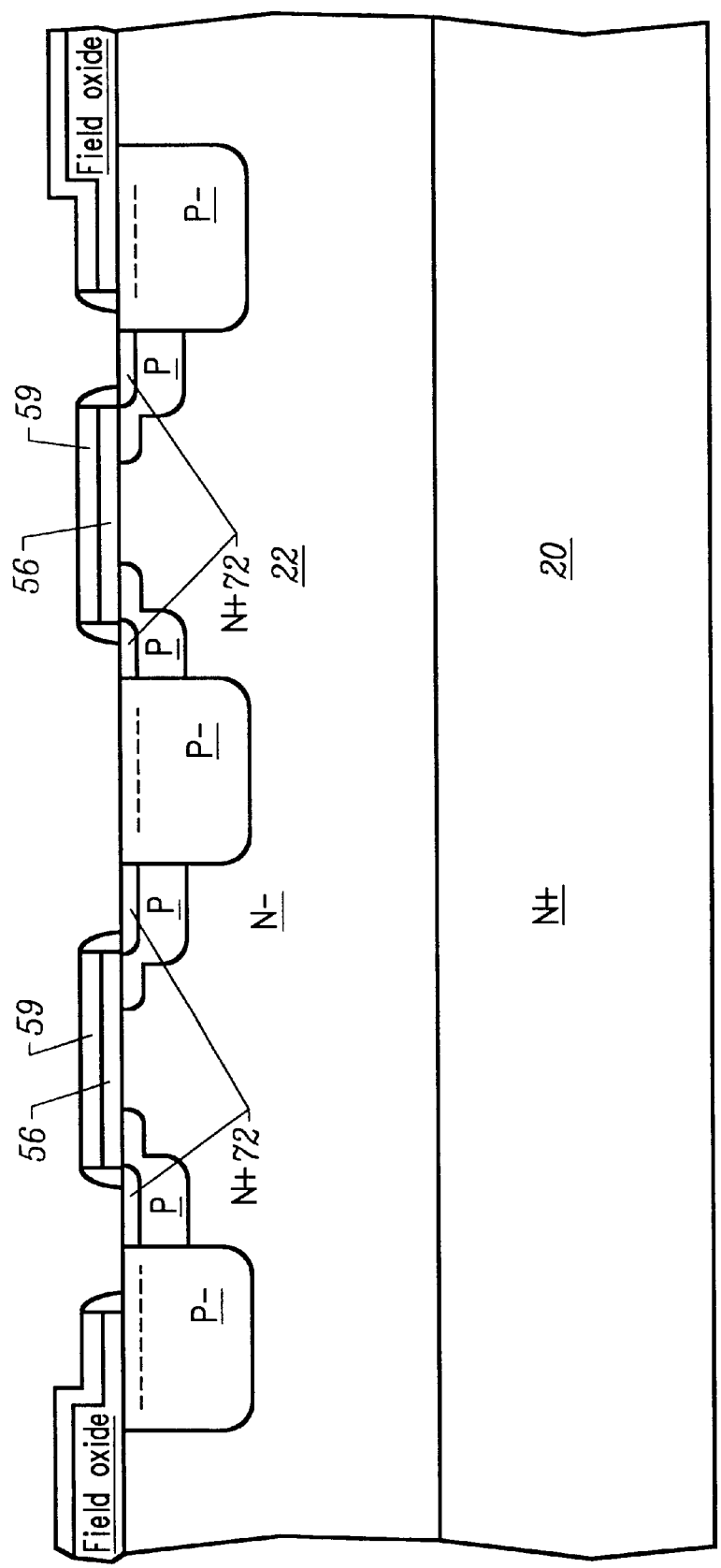
Figure 29A:
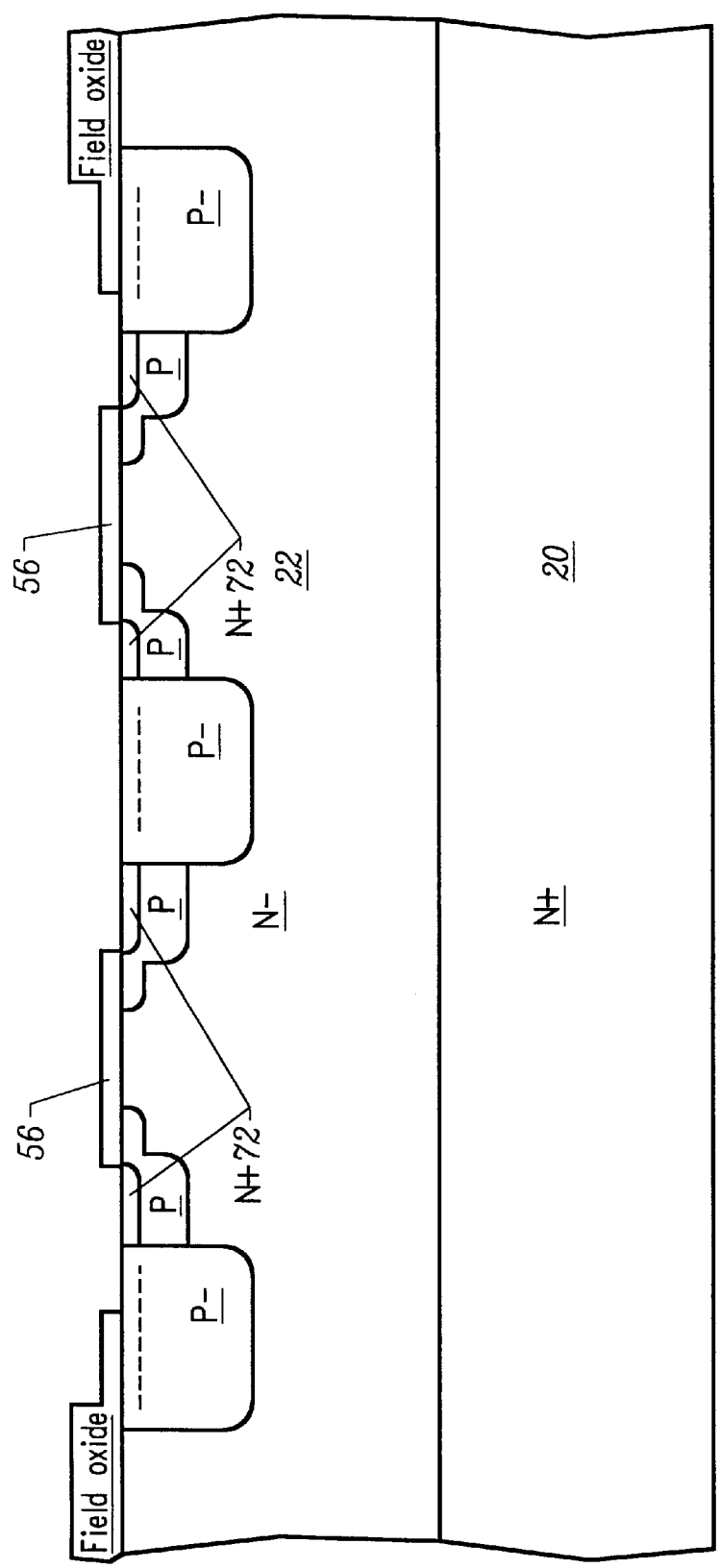
Figure 29B:
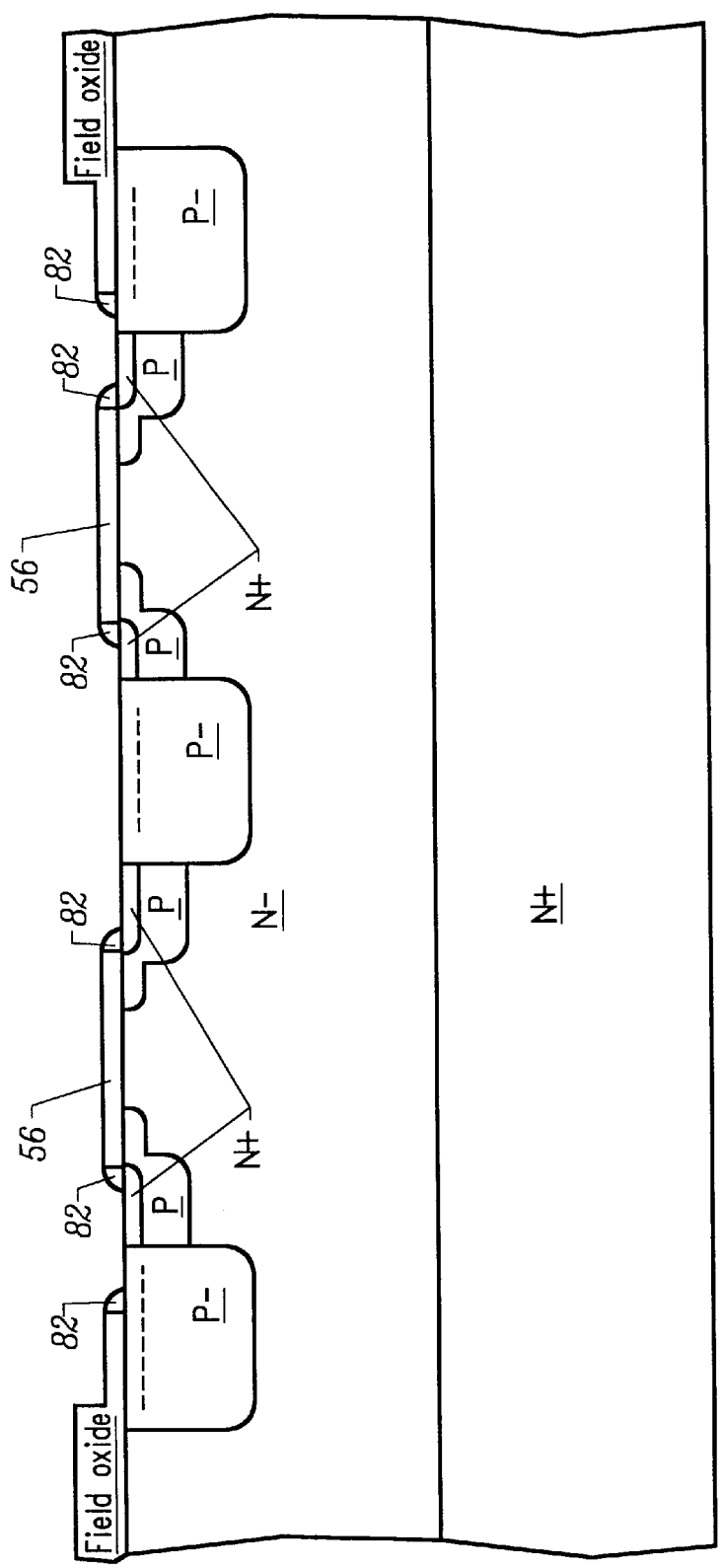

In FIG. 29 spacer 66 and pedestal 62 are removed by wet chemical etch (protection spacers 82 protect the gate structures) or by anisotropic dry etch if the protection spacers 82 are not formed prior to removal. Thereafter as shown in FIG. 29A the silicon nitride 59 is removed along with protection spacers 82 by wet chemical etch. Alternatively, is shown in FIG. 29B anisotropic dry etch can be used to remove the top nitride and still leave a portion of protection spacer 82.

Figure 30:
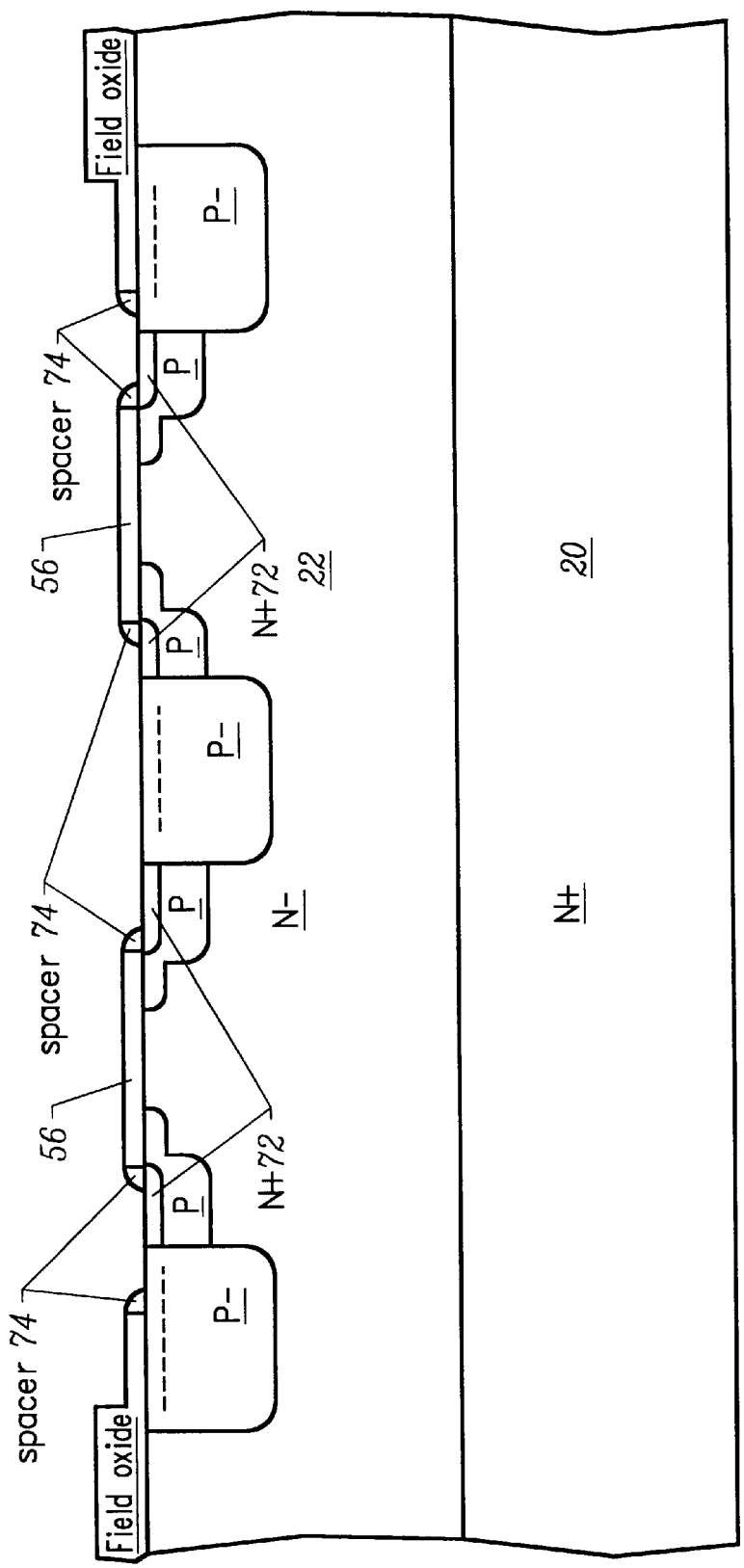
Figure 31:
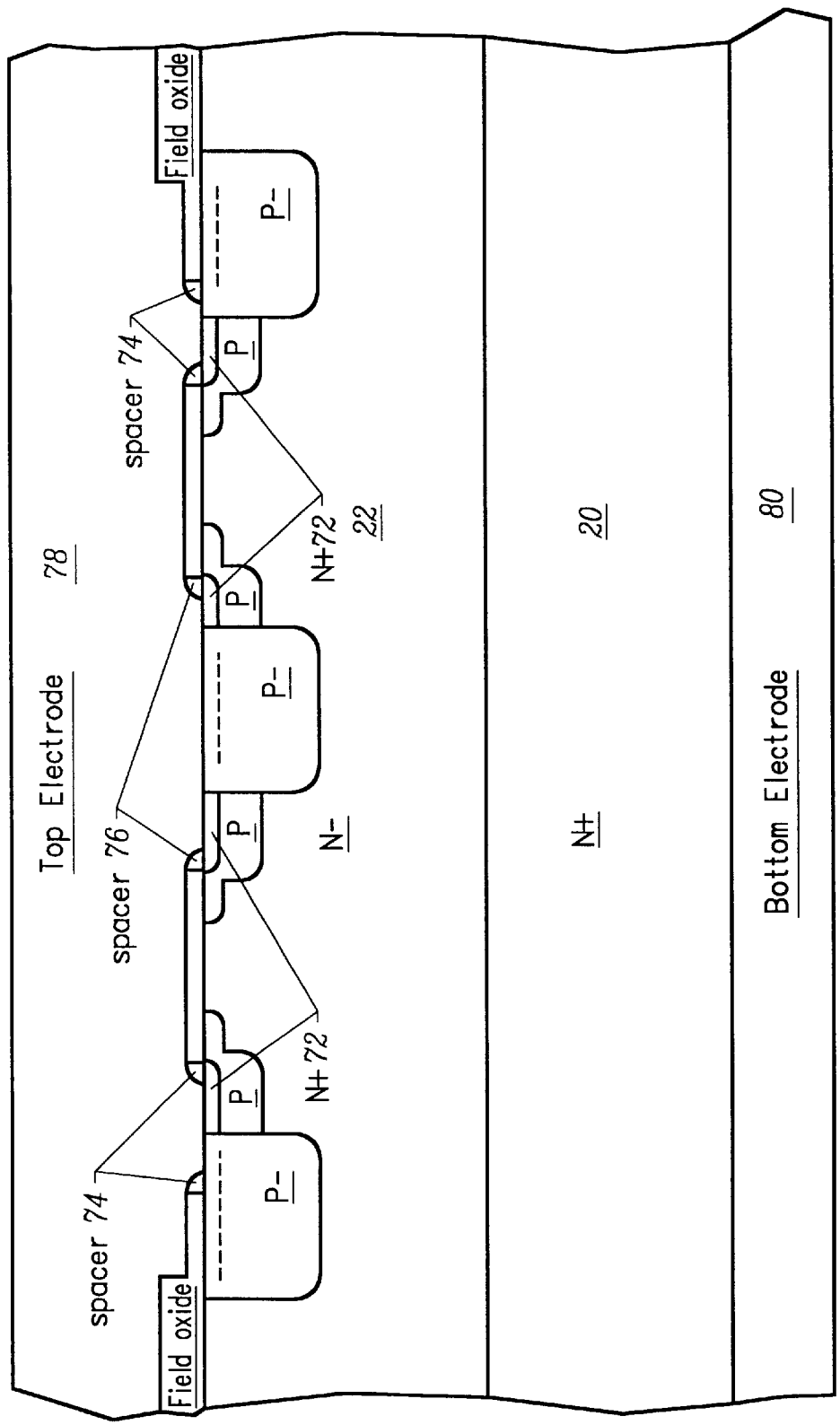

Next is shown in FIG. 30 10–70 nm layer of silicon nitride, silicon oxide or polysilicon is deposited and anisotropically etched to form spacers 74, which is an optional process. Finally as shown in FIG. 31 a top electrode and metal gate 78 is formed along with the bottom electrode 80, similar to the process illustrated in FIG. 19.

The described processes provide enhancements in the fabrication of power rectifier devices which makes the process compatible with older equipment and also provides enhancements using protective spacers and in providing for metal gate structures. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating a semiconductor rectifier device comprising the steps of;
   a) providing a semiconductor substrate of a first conductivity type and having opposing major surfaces,
   b) forming a first silicon oxide layer on a first major surface,
   e) forming a first doped polysilicon layer on the first silicon oxide layer,
   d) forming pedestals of silicon oxide on the first polysilicon layer as a dopant implant mask,
   e) implanting first ions of a second conductive type in the substrate using the pedestals as a mask,
   f) forming sidewall spacers on the pedestals,
   g) implanting second ions of the second conductive type deeper into the substrate than the first ions using the pedestals with sidewalls as a mask,
   h) removing the first polysilicon layer and the first silicon oxide layer exposed between pedestals and sidewall spacers to define gates under the pedestals and sidewall spacers,
   i) implanting third ions of the first conducting type into the substrate and shallower than the first ions using the pedestals with sidewalls as a mask,
   j) annealing the implanted ions to form doped regions,
   k) removing the pedestals and sidewall spacers, and
   l) forming conductive metal layers on the first major surface and on the second major surface.

2. The method of claim 1 wherein first ions define a channel region, second ions separate source/drain regions from the substrate of first conductive type, and the third ions define the source/drain regions.

3. The method of claim 2 wherein first and second ions are boron or $BF_2$, and the third ions are arsenic, phosphorus, or antimony.

4. The method of claim 2 wherein the substrate comprises an N+ doped substrate and an N– epitaxial layer on the substrate.

5. The method of claim 4 wherein in step h) the first polysilicon layer is removed after step f) and the first silicon oxide layer is removed after step (g).

6. The method of claim 1 wherein in step h) the first polysilicon layer is removed after step f) and the first silicon oxide layer is removed after step g).

7. The method of claim 1 wherein in step k) the pedestals and sidewall spacers are removed by anisotropic etch.

8. The method of claim 1 and including before step k) the formation of protective spacers on the sidewalls of the gate and gate oxide, and in step k) the pedestal and sidewall spacers are removed by wet chemical etch.

9. The method as defined in claim 1 wherein in step c) the first polysilicon layer is formed in situ.

10. The method as defined by claim 1 wherein in step c) the first polysilicon layer is formed by dopant implant.

11. The method of claim 1 wherein before step l) protective spacers are formed on the sidewalls of the gate oxide.

12. A method of fabricating a semiconductor rectifier device comprising the steps of:
   a) providing a semiconductor substrate of a first conductivity type and having opposing major surfaces,
   b) forming a first silicon oxide layer on a first major surface,
   c) forming a silicon nitride layer on the first silicon oxide layer,
   d) forming pedestals of silicon oxide on the first silicon nitride layer as a dopant implant mask,
   e) implanting first ions of a second conductive type in the substrate using the pedestals as a mask,
   f) forming sidewall spacers on the pedestals,
   g) implanting second ions of the second conductive type deeper into the substrate than the first ions using the pedestals with sidewalls as a mask,
   h) removing the first silicon nitride layer and first silicon oxide layer between the pedestals and sidewall spacers, thereby forming gate oxide under the pedestals and sidewall spacers,
   i) implanting third ions of the first conductivity type into the substrate and shallower than the first ions using the pedestals with sidewalls as a mask, j) annealing the implanted ions to form doped regions, k) removing the pedestals and sidewall spacers, l) removing silicon nitride covered by the pedestals leaving gate oxide, and m) forming conductive metal layers on the first major surface and on the second major surface.

13. The method of claim 12 wherein first ions define a channel region, second ions separate source/drain regions from the substrate of the first conductive type, and the third ions define the source/drain regions.

14. The method of claim 13 wherein first and second ions are boron or $BF_2$, and the third ions are arsenic, phosphorus, or antimony.

15. The method of claim 13 wherein the substrate comprises an N+ doped substrate and an N− epitaxial layer on the substrate.

16. The method of claim 12 wherein the silicon nitride layer is removed after step f) and the first silicon oxide layer is removed after step g).

17. The method of claim 12 wherein in step k) the pedestals and sidewall spacers are removed by anisotropic etch.

18. The method of claim 12 and including before step k) the formation of protective spacers on the sidewalls of the gate and gate oxide, and in step k) the pedestal and sidewall spacers are removed by wet chemical etch.

19. The method of claim 12 wherein before step m) protective spacers are formed on the sidewalls of the gate oxide.

20. The method of claim 12 wherein in step l) anisotropic etching is used, thereby leaving sidewall spacers.

* * * * *